United States Patent
Kim et al.

(10) Patent No.: US 9,385,109 B2
(45) Date of Patent: Jul. 5, 2016

(54) SEMICONDUCTOR PACKAGES HAVING TRENCH-SHAPED OPENING AND METHODS FOR FABRICATING THE SAME

(71) Applicants: Sangwon Kim, Hwasung (KR);
Seunghun Han, Hwasung (KR)

(72) Inventors: Sangwon Kim, Hwasung (KR);
Seunghun Han, Hwasung (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/531,994

(22) Filed: Nov. 3, 2014

(65) Prior Publication Data
US 2015/0123290 A1    May 7, 2015

(30) Foreign Application Priority Data
Nov. 7, 2013    (KR) ........................ 10-2013-0134930

(51) Int. Cl.
*H01L 23/02*    (2006.01)
*H01L 25/10*    (2006.01)
*H01L 23/31*    (2006.01)

(52) U.S. Cl.
CPC .......... *H01L 25/105* (2013.01); *H01L 23/3128* (2013.01); *H01L 2224/16225* (2013.01); *H01L 2224/32145* (2013.01); *H01L 2224/32225* (2013.01); *H01L 2224/48091* (2013.01); *H01L 2224/73253* (2013.01); *H01L 2224/73265* (2013.01); *H01L 2225/1023* (2013.01); *H01L 2225/1058* (2013.01); *H01L 2225/1082* (2013.01); *H01L 2924/15311* (2013.01); *H01L 2924/18161* (2013.01)

(58) Field of Classification Search
CPC .......... H01L 2924/15311; H01L 2224/32145; H01L 2224/16145; H01L 25/0657

USPC .......................................... 257/686, 777, 778
See application file for complete search history.

(56) References Cited

U.S. PATENT DOCUMENTS

| | | | |
|---|---|---|---|
| 7,619,305 B2 | 11/2009 | Fan et al. | |
| 7,964,952 B2 | 6/2011 | Lee | |
| 8,067,306 B2 | 11/2011 | Yang et al. | |
| 8,076,765 B2 | 12/2011 | Chen et al. | |
| 8,310,051 B2 | 11/2012 | Chen et al. | |
| 8,462,511 B2 | 6/2013 | Lee | |
| 8,963,311 B2 * | 2/2015 | Zhao | ............................. 257/686 |
| 9,006,032 B2 * | 4/2015 | Cheng | ..................... H01L 24/81 257/686 |

(Continued)

FOREIGN PATENT DOCUMENTS

| | | |
|---|---|---|
| JP | 5135828 | 11/2012 |
| KR | 100702968 | 3/2007 |
| KR | 100914172 | 8/2009 |

*Primary Examiner* — S. V. Clark
(74) *Attorney, Agent, or Firm* — Renaissance IP Law Group LLP

(57) ABSTRACT

Provided are semiconductor packages and methods of fabricating the same. In one embodiment, the package may include an upper package stacked on a lower package, and a plurality of connection terminals electrically connecting the lower and upper packages. The lower package may include a lower package substrate, a lower semiconductor chip mounted on the lower package substrate, and a lower mold layer provided on the lower package substrate to mold the lower semiconductor chip. The lower mold layer may have a trench-shaped first opening through which the lower package substrate is exposed in a substantially line shape. The connection terminals may be electrically connected to the lower package substrate exposed by the first opening and be not in contact with the lower mold layer.

20 Claims, 27 Drawing Sheets

(56) References Cited

U.S. PATENT DOCUMENTS

| | | | |
|---|---|---|---|
| 2005/0012195 A1* | 1/2005 | Go | H01L 23/3128 257/686 |
| 2007/0063332 A1* | 3/2007 | Go | H01L 23/3128 257/686 |
| 2007/0114677 A1 | 5/2007 | Kwon et al. | |
| 2009/0045523 A1 | 2/2009 | Fan et al. | |
| 2010/0072600 A1* | 3/2010 | Gerber | H01L 21/561 257/686 |
| 2010/0171205 A1 | 7/2010 | Chen et al. | |
| 2010/0213591 A1 | 8/2010 | Ho et al. | |
| 2011/0176280 A1 | 7/2011 | Lee | |
| 2011/0210437 A1 | 9/2011 | Yang et al. | |
| 2012/0032314 A1 | 2/2012 | Chen et al. | |
| 2012/0139090 A1* | 6/2012 | Kim | H01L 25/16 257/659 |
| 2013/0270685 A1* | 10/2013 | Yim | H01L 23/10 257/686 |
| 2015/0091149 A1* | 4/2015 | Jang | H01L 23/3128 257/686 |
| 2015/0130041 A1* | 5/2015 | Seo | H01L 25/50 257/686 |

* cited by examiner

SEMICONDUCTOR PACKAGES HAVING TRENCH-SHAPED OPENING AND METHODS FOR FABRICATING THE SAME

CROSS-REFERENCE TO RELATED APPLICATIONS

This U.S. non-provisional patent application claims priority under 35 U.S.C. §119 to Korean Patent Application No. 10-2013-00134930, filed on Nov. 7, 2013, in the Korean Intellectual Property Office, the entire contents of which are hereby incorporated by reference.

BACKGROUND

Example embodiments of the inventive concept relate to a semiconductor device, and in particular, to semiconductor packages having trench-shaped opening and methods for fabricating the same.

In the semiconductor industry, various package technologies have been developed to meet demands for large storage capacity, thin and small-sized semiconductor devices and/or electronic appliances. One approach has been a package technology through which semiconductor chips are stacked to realize a high density chip stack. This package technology can integrate many kinds of semiconductor chips in smaller areas compared to a conventional package with a single semiconductor chip.

However, the production of a multi-chip stack package can result in a reduction in yield compared to a single chip package. A package-on-package (POP) technology has been developed to deal with the reduction in yield and to still realize a high density chip stack.

Using the POP technology, known good packages are stacked to reduce the inferiority of the final product. This POP type package can be used to meet the desired trend toward both compact electronic portable appliances and mobile products having multiple functions.

SUMMARY

In some embodiments, a semiconductor package comprising: an upper semiconductor package stacked on a lower semiconductor package; and a plurality of connection terminals electrically connecting the lower and upper semiconductor packages, wherein the lower semiconductor package includes a lower semiconductor package substrate, a lower semiconductor chip mounted on the lower semiconductor package substrate, and a lower mold layer at least partially encapsulating the lower semiconductor chip, wherein the lower mold layer has a first opening formed therein, and wherein two or more connection terminals are disposed within the first opening.

A top surface of the lower package substrate may be exposed through the first opening. A bottom surface of the first opening may be spaced apart from a top surface of the lower package substrate. The bottom surface of the first opening may be defined by a portion of the lower mold layer. The first opening may have a trench shape. The two or more connection terminals may be spaced apart from a sidewall of the first opening formed in the lower mold layer.

In some embodiments, the first opening may extend along four sides of the lower semiconductor chip without interruption. The first opening may have a substantially straight line shape. The lower mold layer may include an inner mold layer and an outer mold layer having the first opening disposed therebetween.

In some embodiments, the lower mold layer may include at least one protruding portion at a corner of the lower package substrate. A second opening may be formed through the at least one protruding portion to expose at least one of the lower terminals at a corresponding corner of the lower semiconductor package. The second opening may comprise a plurality of second openings, each having a hole shape.

According to one aspect of the inventive concepts, a first pitch between connection terminals in the first opening may be different from a second pitch between connection terminals in the second openings. The first pitch may be smaller than the second pitch.

In some embodiments, the first opening may have an internal side surface arranged at an angle with respect to a top surface of the lower package substrate. The first opening may have an internal side surface slanted with respect to a top surface of the lower package substrate. A top surface of the lower semiconductor chip may be substantially coplanar with a top surface of the lower mold layer. A height of the lower mold layer may be substantially the same as or higher than a height of the lower semiconductor chip.

In some embodiments, the first opening may extend around substantially the entire perimeter of the lower semiconductor chip.

In some embodiments, the first opening may comprise multiple trenches extending along fewer than all of sidewalls of the lower semiconductor chip.

In some embodiments, the upper semiconductor package may include an upper semiconductor package substrate and an upper semiconductor chip mounted on the upper semiconductor package substrate, further comprising another mold layer covering the lower mold layer. Another mold layer may fill the first opening of the lower mold layer.

In some embodiments, a semiconductor package comprising: a lower package substrate; a first semiconductor chip mounted on the lower package substrate; a lower mold layer covering a top surface of the lower package substrate, the lower mold layer having a trench-shaped opening formed therein; a plurality of terminals disposed within the trench-shaped opening on the top surface of the package substrate, the plurality of terminals spaced apart from a sidewall of the trench-shaped opening; and an upper package substrate overlying the first semiconductor chip, the upper package substrate having a second semiconductor mounted thereon, wherein the plurality of terminals are electrically connected to the upper package substrate.

In some embodiments, the trench-shape opening extends along a substantial portion of the length of at least one side of the lower package substrate.

In some embodiments, a semiconductor package comprising: a base substrate; an upper semiconductor package and a lower package sequentially stacked on the base substrate; and a plurality of connection terminals electrically connecting the lower and upper packages, wherein the lower semiconductor package includes a lower package substrate, a lower semiconductor chip mounted on the lower package substrate, and a first mold layer at least partially encapsulating the lower semiconductor chip, wherein the first mold layer has an opening, and wherein two or more connection terminals are disposed within the opening; and a second mold layer encapsulating the lower package including the lower package substrate, the second mold layer covering the first mold layer. The second mold layer may fill the opening. The upper package may include an upper semiconductor chip mounted on an upper package substrate and may further include a heat dissipation layer disposed between a top surface of the lower semiconductor chip and a bottom surface of the upper package substrate. The upper package may include an upper semiconductor chip mounted on an upper package substrate, wherein a gap is disposed between a top surface of the lower semiconductor chip and a bottom surface of the upper package substrate.

In some embodiments, a method of forming a semiconductor package comprising: providing a lower package substrate having a first semiconductor chip mounted thereon, the lower package substrate including lower terminals mounted on a peripheral region thereof; forming a lower mold layer covering a top surface of the lower package substrate; and form an opening in the lower mold layer by removing a portion of the lower mold layer, the opening exposing at least two or more of the lower terminals.

The method may further comprise placing an upper package substrate over the lower package substrate, the upper package substrate having a second semiconductor chip mounted thereon, the upper package substrate having upper terminals on its bottom surface, the upper terminals contacting corresponding ones of the lower terminals; and forming connection terminals from the lower and upper terminals that connect the lower and upper package substrates.

In some embodiments, forming connection terminals may comprise performing a reflowing process on the lower and upper terminals.

In some embodiments, a method of forming a semiconductor package may include providing a lower package substrate having a first semiconductor chip mounted thereon; forming a lower mold layer covering a top surface of the lower package substrate; removing a portion of the lower mold layer to form a trench-shaped opening therein, arranging two or more lower terminals within the trench-shaped opening; placing an upper package substrate over the lower package substrate, the upper package substrate having a second semiconductor chip mounted thereon, the upper package substrate having upper terminals on its bottom surface, the upper terminals contacting corresponding ones of the lower terminals; and forming connection terminals from the lower and upper terminals that connect the lower and upper package substrates.

In some embodiments, removing a portion of the lower mold layer comprises laser drilling or etching.

In some embodiments, a method of forming a semiconductor package may comprise: providing a first package substrate having a first semiconductor chip and a plurality of first terminals mounted thereon; forming a mold layer covering a top surface of the first package substrate and the plurality of first terminals; and removing a portion of the mold layer to expose a peripheral region of the top surface of the first package substrate, leaving a portion of the mold layer in a center region of the first package substrate, wherein the two or more first terminals are disposed within the exposed peripheral region of the top surface of the first package substrate.

The method may further comprises: placing a second package substrate over the first package substrate, the second package substrate having a second semiconductor chip mounted thereon, the second package substrate having second terminals on its bottom surface, the second terminals contacting corresponding ones of the first terminals; and forming connection terminals from the first and second terminals that connect the first and second package substrates.

In some embodiments, removing a portion of the mold layer to expose a peripheral region of the top surface of the first package substrate may comprise leaving a portion of the mold layer only in a center region of the first package substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
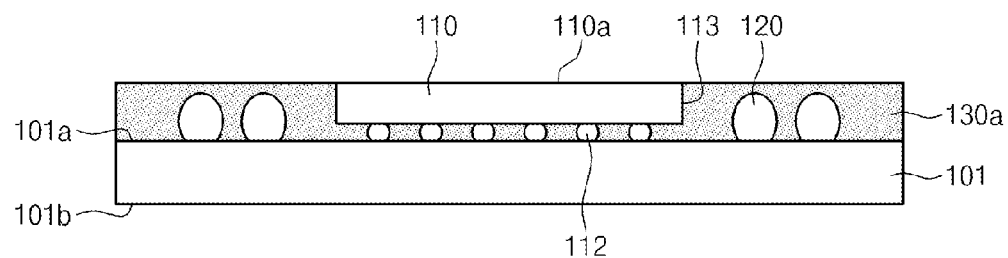
FIGS. 1A through 1E are cross-sectional views illustrating a method of fabricating a semiconductor package, according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Example Embodiments

FIGS. 1A through 1D are cross-sectional views illustrating a method of fabricating a semiconductor package, according to example embodiments of the inventive concept. FIG. 2A is a plan view of FIG. 1A, and FIG. 2B is a plan view of FIG. 1B.

Referring to FIG. 1A, a lower package substrate 101 with a top surface 101a and a bottom surface 101b may be provided. The lower package substrate 101 may be any suitable package substrate, for example, a printed circuit board. A lower semiconductor chip 110 may be mounted on the top surface 101a of the lower package substrate 101 using surface mount technologies (SMT) such as a flip-chip bonding technology. A mold material layer 130a may then be formed to mold or encapsulate the lower semiconductor chip 110 as shown in FIG. 2A. A top surface of the lower semiconductor chip 110 may be exposed through the mold material layer 130a. The top surface 110a of the lower semiconductor chip 110 may be, for example, an inactive surface.

The lower semiconductor chip 110 may be electrically connected to the lower package substrate 101 through, for example, a plurality of conductive bumps 112 such as solder bumps. The lower semiconductor chip 110 may be one of a memory chip for storing data, a logic chip for processing data, or any combination thereof. For example, the lower semiconductor chip 110 may be a logic chip.

A plurality of lower terminals 120 (e.g., connectional terminals such as solder balls) may be provided on the top surface 101a of the lower package substrate 101. Initially, the lower terminals 120 may be fully covered with the mold material layer 130a. For this reason, the lower terminals 120 may not be exposed to the outside. For example, a thickness of the lower terminal 120 may be less than or approximately equal to that of the mold material layer 130a. In some embodiments, the lower terminals 120 may be disposed on an edge region of the top surface 101a of the lower package substrate 101. For example, the lower semiconductor chip 110 may be disposed on a center region of the top surface 101a of the lower package substrate 101, and the lower terminals 120 may be disposed around the side surface of the lower semiconductor chip 110.

Figure 1B:
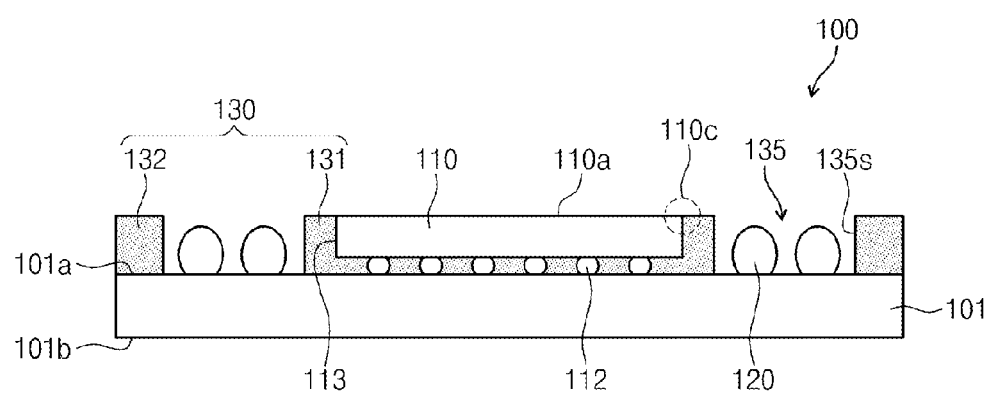
Figure 2A:
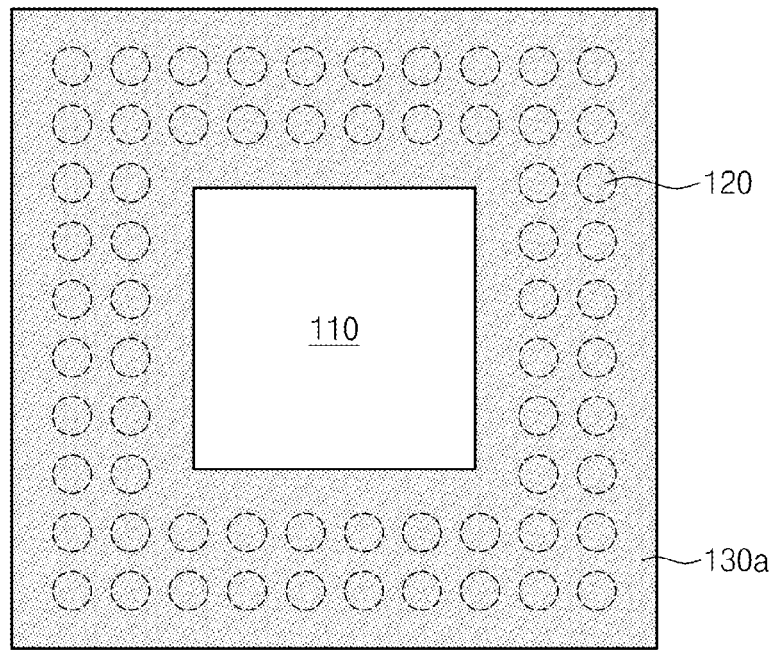
FIG. 2A is a plan view of FIG. 1A.
Figure 2B:
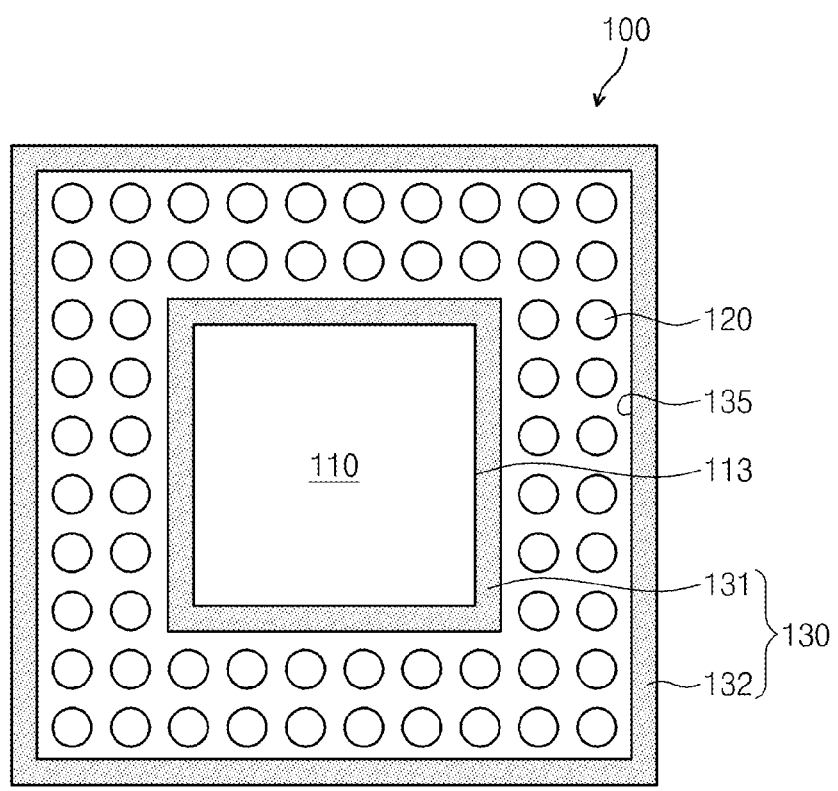
FIG. 2B is a plan view of FIG. 1B.

Referring to FIG. 1B, the mold material layer 130a may be patterned to form a lower mold layer 130. The lower mold layer 130 may be formed to have an opening 135 exposing the lower terminals 120. For example, a laser drilling process may be performed on the mold material layer 130a so as to form the lower mold layer 130 having the opening 135, as shown in FIG. 2B. The opening 135 may have various shapes such as a trench shape suitable to expose the lower terminals 120. The opening 135 may be formed by, for example, irradiating a laser beam linearly back and forth on the mold material layer 130a.

In some embodiments, the top surface 101a of the lower package substrate 101 may be exposed through the opening 135.

Figure 1C:
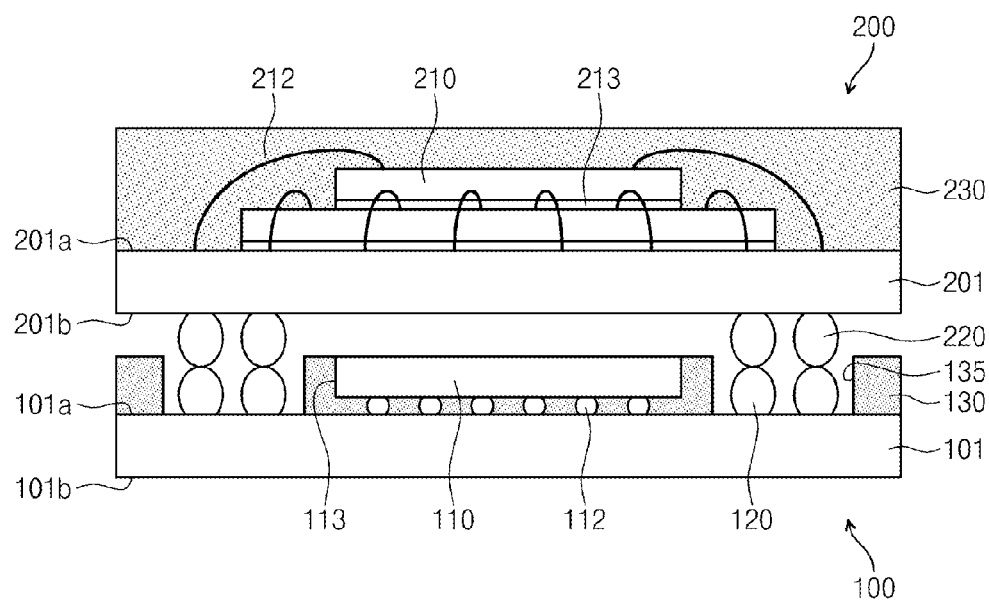
Figure 1D:
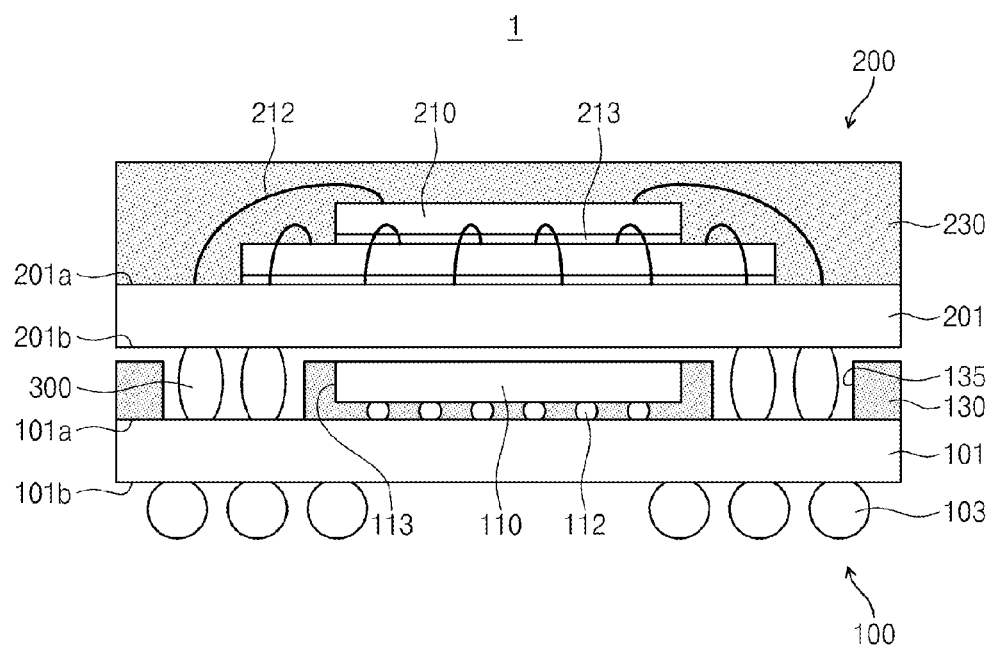
Figure 1E:
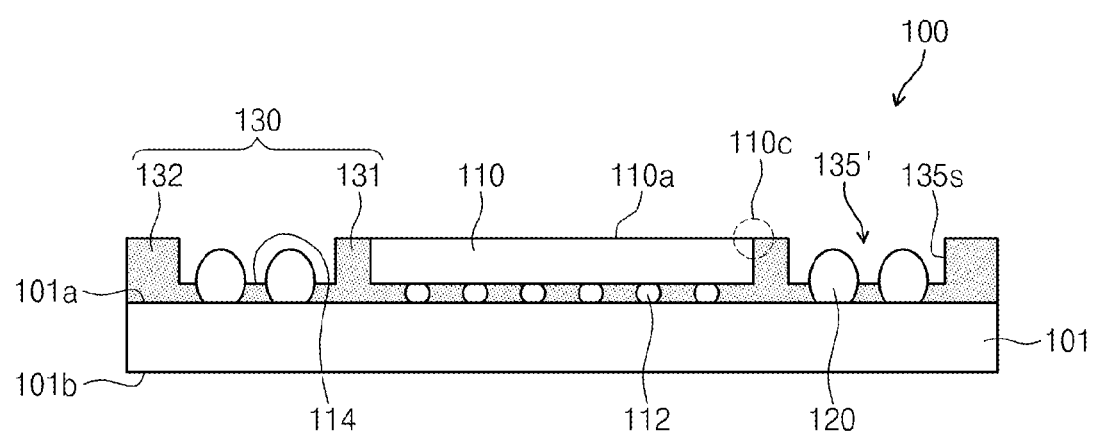

Alternatively, as shown in FIG. 1E, an opening 135' may be formed in such a way that a bottom surface 114 of the opening 135' may be spaced apart from the top surface 101a of the lower package substrate 101. Such an opening 135' may be formed by irradiating a laser beam on the mold material layer 130a and stopping the irradiation process before the top surface 101a of the lower package substrate 101 is exposed. In this case, the bottom surface 114 of the opening 135' may be defined by a bottom portion of the lower mold layer 130.

In one embodiment, the opening 135 may substantially continuously extend along the lower package substrate 101 approximately parallel to and around the side surfaces of the lower semiconductor chip 110, thereby having a trench shaped structure exposing the lower terminals 120 as shown in FIG. 2B.

The opening 135 may be formed in such a way that an internal side surface 135s thereof is spaced part from the lower terminals 120. For example, the lower mold layer 130 may not be in contact with the lower terminals 120. The internal side surface 135s of the opening 135 may be substantially perpendicular to the top surface 101a of the lower package substrate 101. The lower mold layer 130 may be divided by the opening 135 so as to include an inner lower mold layer 131 enclosing the side surface 113 of the lower semiconductor chip 110 and an outer lower mold layer 132 provided on the edge region of the lower package substrate 101. The lower terminals 120 may be provided between the inner lower mold layer 131 and the outer lower mold layer 132 on the lower package substrate 101. In certain embodiments, the inner lower mold layer 131 may be provided to enclose substantially all or part of the side surface 113 of the lower semiconductor chip 110, thereby substantially preventing a corner portion 110c of the top surface 110a of the lower semiconductor chip 110 from being broken or damaged.

As a result, there may be fabricated a lower package 100 having the lower mold layer 130 that molds the lower semiconductor chip 110 mounted on the lower package substrate 101 and has the opening 135 exposing the lower terminals 120. In an aspect of the inventive concept, two or more lower terminals 120 may be disposed within the opening 135.

In the above described embodiment, the opening (or trench) 135 may extend around substantially the entire perimeter of the lower semiconductor chip 110 and encompass all of the lower terminals 120 within a single opening or trench as illustrated in FIG. 2B. In this case, the opening 135 may extend along four sides of the lower semiconductor chip 110 without interruption.

In some other embodiments, however, the opening 135 may include multiple trenches each extending along fewer than all of the sidewalls of the lower semiconductor chip 110 and encompassing at least two, but fewer than all of, the lower terminals 120. For example, as shown in FIG. 2C, each trench 135a may be arranged along a single sidewall of the lower semiconductor chip 110 and encompass substantially all of the lower terminals 120 arranged along that sidewall.

Figure 2C:
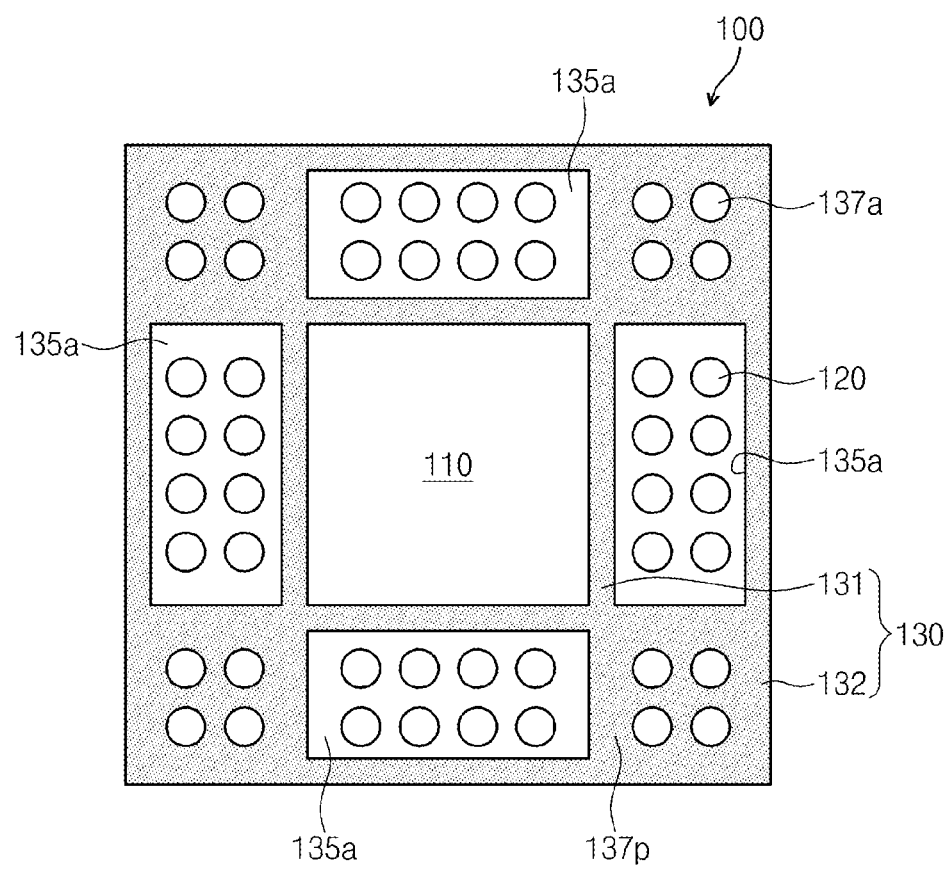
FIGS. 2C and 2D are modifications of an embodiment shown in FIG. 2B.

In FIG. 2C, the lower mold layer 130 may include an inner lower mold layer 131 and an outer lower mold layer 132. The outer lower mold layer 132 may include at least one protruding portion 137p extending from its corner portion toward the lower semiconductor chip 110. One or more second openings 137a may be formed in each protruding portion 137p to expose at least one of the lower terminals 120 provided at a corresponding corner of the top surface 101a of the lower package substrate 101. Each of the second openings 137a may have a hole shape in plan view. However, the second openings 137a may have other suitable shapes such as a rectangular or square shape in plan view.

Alternatively, although not shown, multiple trenches may be provided, with each trench extending along only a portion of a length of a side of a package substrate 101 and encompassing fewer than all of the lower terminals 120 arranged along that side of the package substrate 101. The trenches may, for example, have a square or rectangular shapes encompassing two, four, six, eight, etc., of the lower terminals 120. The trenches could also have an L-shape or U-shape that extends around one or more corners of the lower semiconductor chip 110 and encompasses lower terminals arranged on multiple sides of the lower semiconductor chip 110.

Figure 2D:
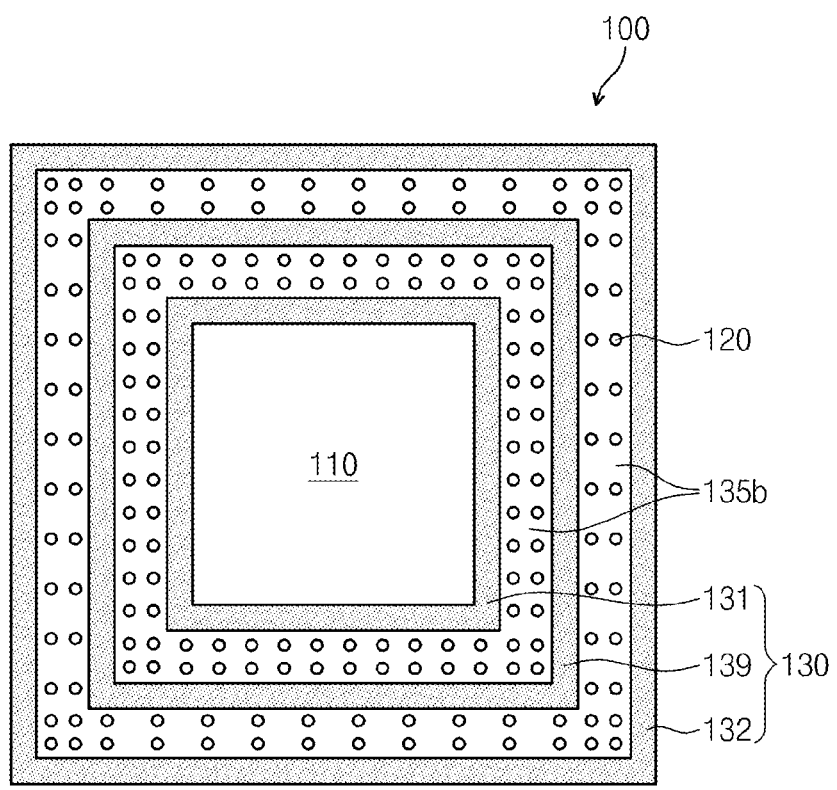

In some other embodiments, as shown in FIG. 2D, two or more trenches 135b may be formed to extend around substantially an entire perimeter of the lower semiconductor chip 110 and each trench may encompass a part of the lower terminals 120 therein as illustrated in FIG. 2B. This embodiment may be useful especially when the size of the lower terminals 120 are smaller and/or the package substrate 101 is larger.

In the embodiment of FIG. 2D, the lower mold layer 130 may include a middle lower mold layer 139 between the inner lower mold layer 131 and the outer lower mold layer 132.

Referring to FIG. 1C, an upper package 200 may be stacked on the lower package 100. The upper package 200 may include an upper package substrate 201 having a top surface 201a and a bottom surface 201b, one or more upper semiconductor chips 210 mounted on the top surface 201a of the upper package substrate 201, an upper mold layer 230 molding the upper semiconductor chips 210, and a plurality of upper terminals 220 attached to the bottom surface 201b of the upper package substrate 201.

The upper package substrate 201 may be formed of a suitable package substrate, for example, a printed circuit board. The upper semiconductor chips 210 may be electrically connected to the upper package substrate 201 through, for example, a plurality of bonding wires 212. In some other embodiments, the upper semiconductor chips 210 may be electrically connected to the upper package substrate 201 via other suitable mounting techniques such as a flip-chip bonding technology. The upper semiconductor chips 210 may be one of a memory chip, a logic chip, or any combination thereof. For example, the upper semiconductor chips 210 may be a memory chip. The upper semiconductor chips 210 may be attached to each other and to the upper package substrate 201, for example, by an insulating adhesive layer 213. The upper package 200 may be stacked on the lower package 100 in such a way that the upper terminals 220 are connected to the lower terminals 120 in a one-to-one manner. In some embodiments, each of the upper terminals 220 may be the same as or similar to a corresponding one of the lower terminals 120, in terms of size or volume. Accordingly, when the upper package 200 is stacked on the lower package 100, selective contact between corresponding ones of the upper terminals 220 and the lower terminals 120, respectively, can be made. Furthermore, it is possible to substantially prevent the upper terminals 220 from being in direct contact with the lower mold layer 130.

Referring to FIG. 1D, a reflow process may be performed to a stack of the lower and upper packages 100 and 200 so as to form connection terminals 300. For example, the reflow process may be performed to the stack, in which the lower terminals 120 are in contact with the upper terminals 220. Thus, the lower and upper terminals 120 and 220 may be fused to form the connection terminals 300. External terminals 103 (e.g., solder balls) may be attached to the bottom surface 101b of the lower package substrate 101. As a result, a package-on-package (POP) type semiconductor package 1 may be fabricated to have the stack of the lower and upper packages 100 and 200, which are electrically connected to each other by the connection terminals 300.

As shown in FIG. 1D, during the reflow process for forming the connection terminal 300, a gas pressure may be increased by gas or fume, which is contained in the lower terminals 120 and/or the upper terminals 220 or is made of constituents used for forming of the lower terminals 120 and/or the upper terminals 220. If the gas or fume is not effectively exhausted, due to the increased gas pressure, a crack may occur between the connection terminals 300 and the lower package substrate 101 or the connection terminals 300 may be detached from the lower package substrate 101, and thus, mechanical and electric characteristics of the semiconductor package 1 may be deteriorated.

According to the present embodiment, the opening 135 may make it possible to efficiently exhaust the gas or fume. Therefore, it may be possible to substantially prevent the gas pressure from being increased, thereby suppressing or reducing the crack or the detachment of the connection terminals 300.

According to some embodiments of the inventive concept, because the opening 135 has a trench-shaped structure, the connection terminals 300 can have improved mechanical and electric characteristics. This will be described in more detail with reference to FIGS. 12A and 12B, and FIGS. 13A and 13B.

Comparative Embodiments

Figure 12A:
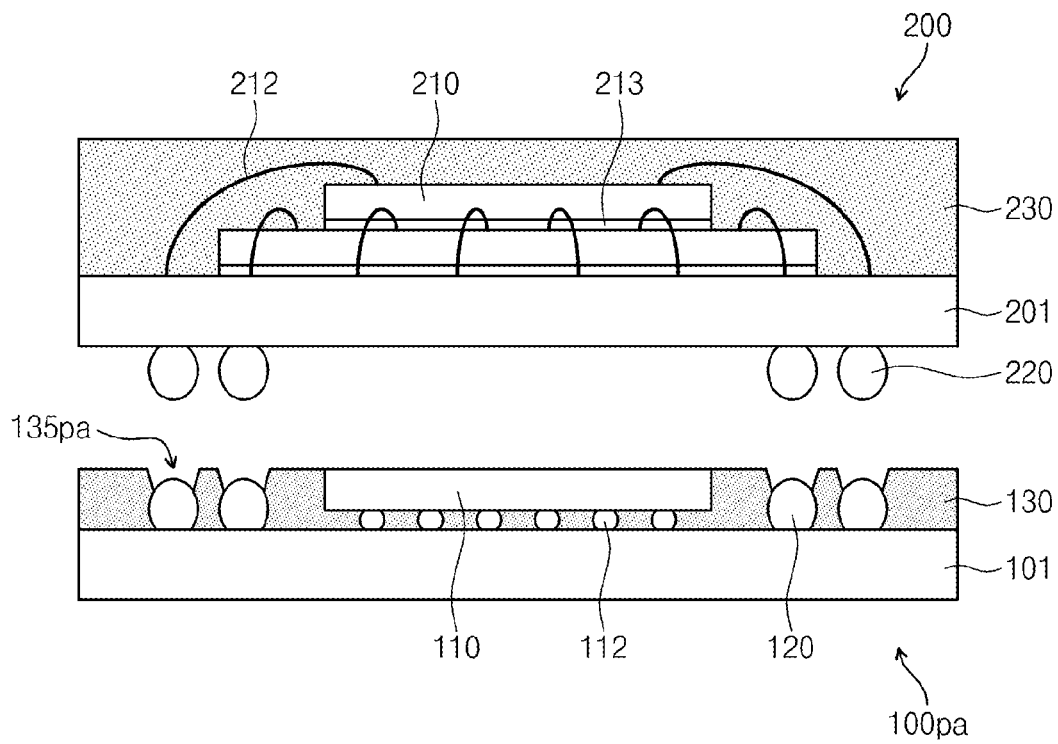
FIGS. 12A and 12B are sectional views illustrating a method of fabricating a semiconductor package, according to comparative embodiments.
Figure 12B:
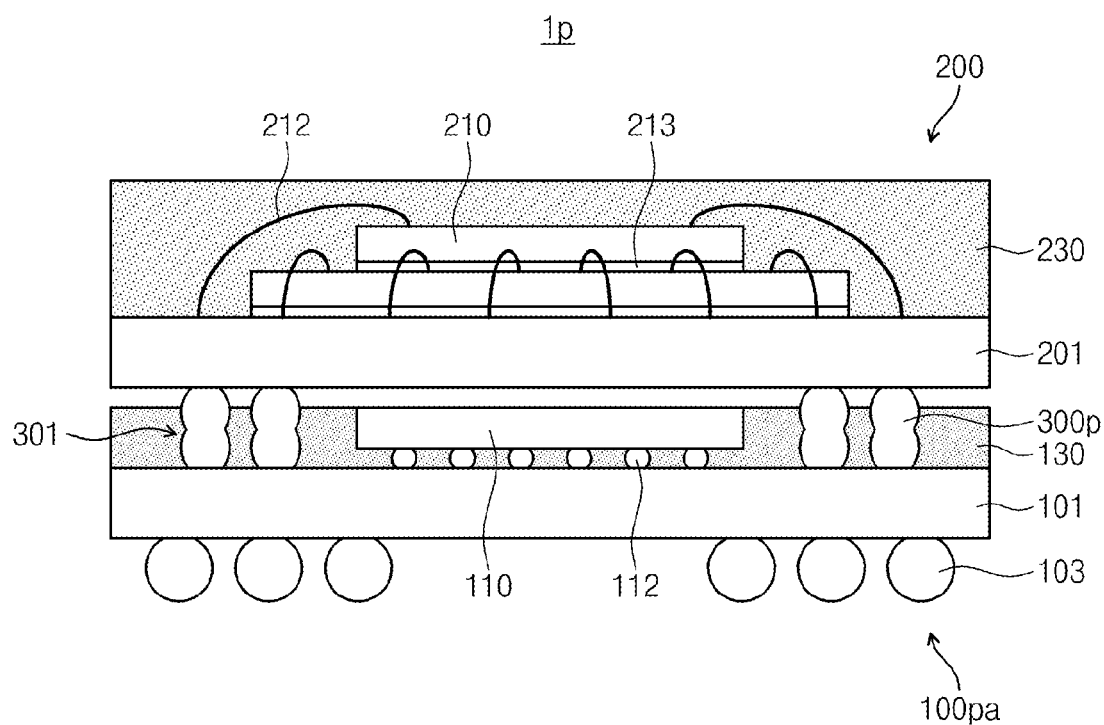

FIGS. 12A and 12B are cross-sectional views illustrating a method of fabricating a semiconductor package, according to comparative embodiments.

Referring to FIG. 12A, according to comparative embodiments, hole-shaped openings 135pa may be formed to expose upper portions of the lower terminals 120. Thereafter, the upper package 200 may be stacked on a lower package 100pa, and then, a reflow process may be performed to the resulting structure.

Referring to FIG. 12B, as the result of the reflow process, the lower terminals 120 and the upper terminals 220 may be connected to form a semiconductor package 1p with connection terminals 300p.

Each of the connection terminals 300p may have a notch 301, whose sectional area is relatively small. If a stress is applied to the semiconductor package 1p, the notch 301 may serve as a weak point to the stress. Further, due to the presence of the notch 301, the connection terminal 300p may have a reduced effective sectional area and thereby have an increased electric resistance. In addition, because there is no gap between the connection terminal 300p and the lower mold layer 130, the gas produced from the reflow process cannot be effectively exhausted, and thus, the crack or the detachment of the connection terminal 300p may occur.

By contrast, according to the present embodiment, since the opening 135 is formed to have a trench-shaped structure, the connection terminals 300 may be formed without any notch, as shown in FIG. 1D. Accordingly, it is possible to substantially prevent technical problems, for example, a weakened stress-resistance of the connection terminal 300 and/or an increased electric resistance of the connection terminal 300, caused by the notch.

Other Comparative Embodiments

Figure 13A:
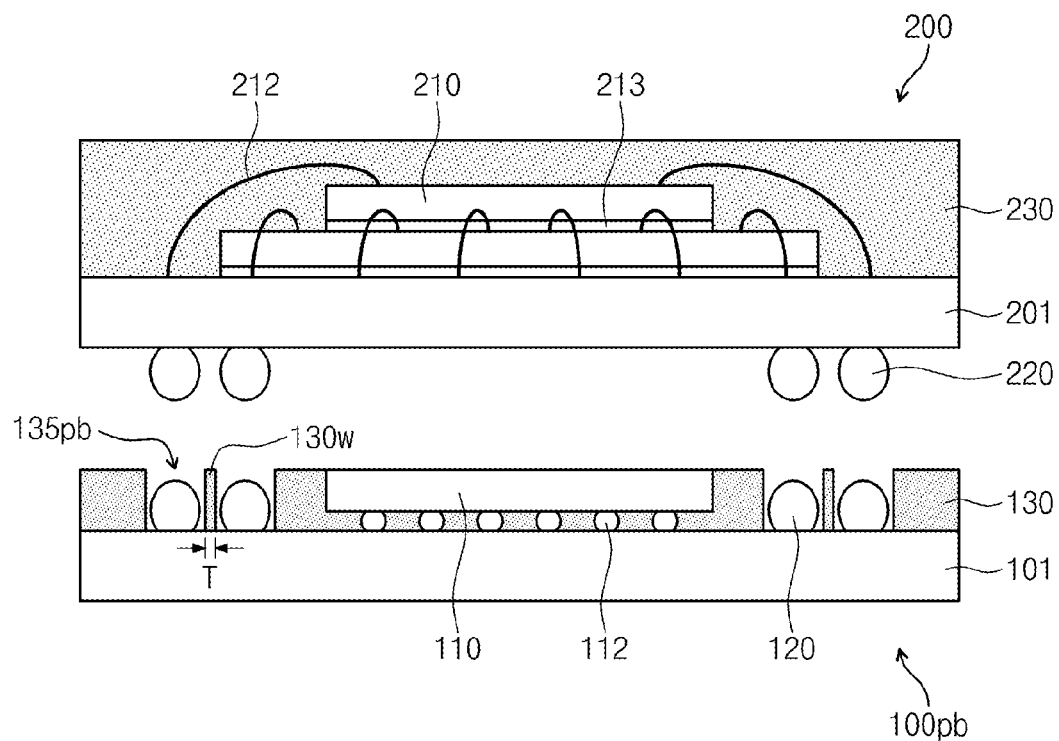
FIGS. 13A and 13B are sectional views illustrating a method of fabricating a semiconductor package, according to other comparative embodiments.
Figure 13B:
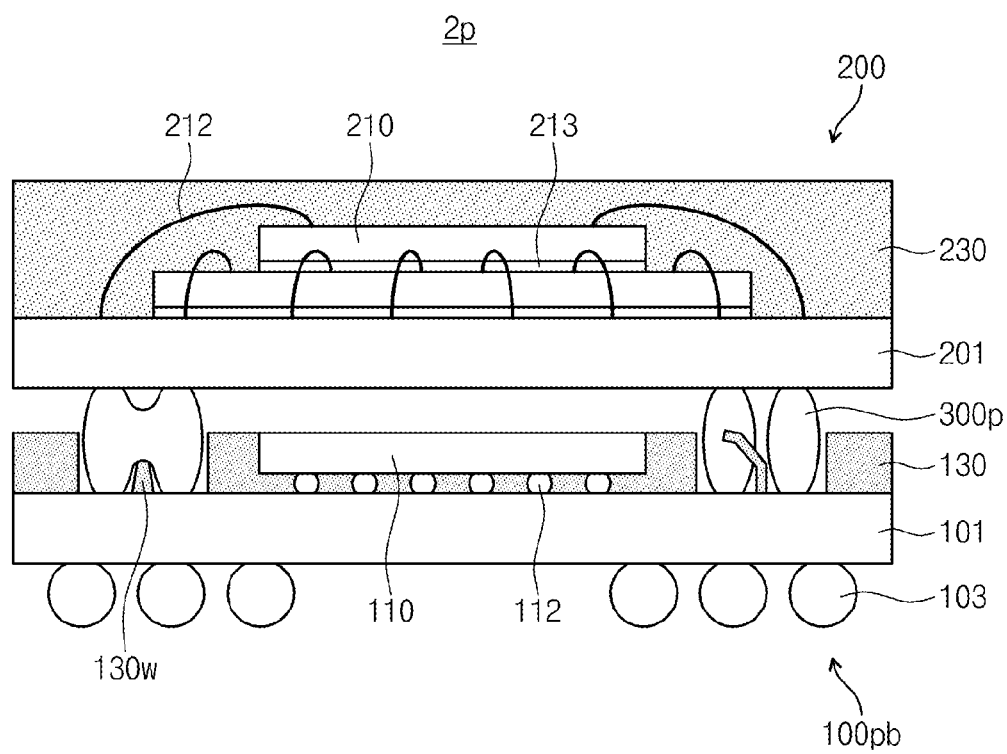

FIGS. 13A and 13B are cross-sectional views illustrating a method of fabricating a semiconductor package, according to other comparative embodiments.

Referring to FIG. 13A, according to other comparative embodiments, hole-shaped openings 135pb may be formed to fully expose the lower terminals 120. In this case, the lower mold layer 130 may include a mold wall 130w, which may be formed between adjacent ones of the lower terminals 120. As the space between the lower terminals 120 decreases, a horizontal thickness T (or a width) of the mold wall 130w may decrease. Thereafter, the upper package 200 may be stacked on a lower package 100pa, and then, a reflow process may be performed on the resulting structure.

Referring to FIG. 13B, as a result of the reflow process, the lower terminals 120 and the upper terminals 220 may be combined to form a semiconductor package 2p with connection terminals 300p. If the mold wall 130w has a small width T, it may collapse or fall toward the lower terminal 120. Accordingly, adjacent ones of the connection terminals 300p may be undesirably connected to each other or the mold wall 130w may be inserted into the connection terminal 300p. As a result, electric characteristics of the semiconductor package 2p may be deteriorated, and a production yield may decrease.

By contrast, according to example embodiments of the inventive concept, because the opening 135 is formed to have a trench-shaped structure, it is possible to substantially prevent the mold wall from being formed between adjacent ones of the lower terminals 120, as shown in FIG. 1B. Accordingly, the semiconductor package 1 can be fabricated without the problems discussed above, for example, the collapse or falling of the mold wall and/or deterioration in electric characteristics or a reduction in a production yield.

Other Example Embodiments

Figure 3A:
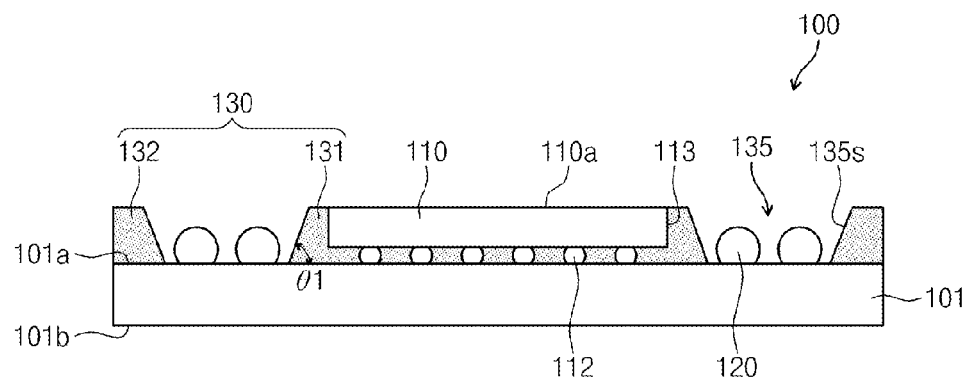
FIGS. 3A through 3C are cross-sectional views illustrating a method of fabricating a semiconductor package, according to other example embodiments of the inventive concept.
Figure 3B:
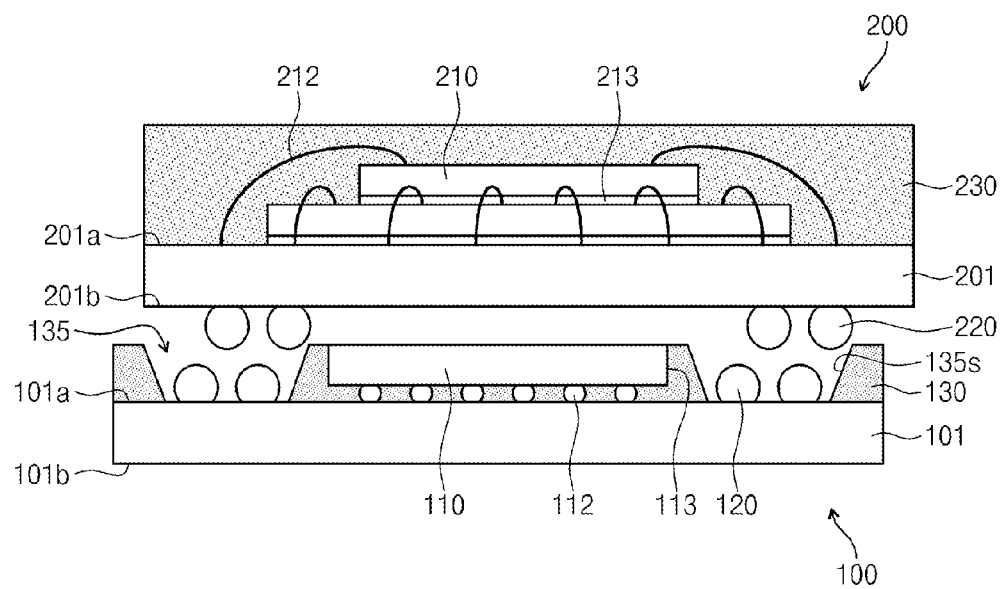
Figure 3C:
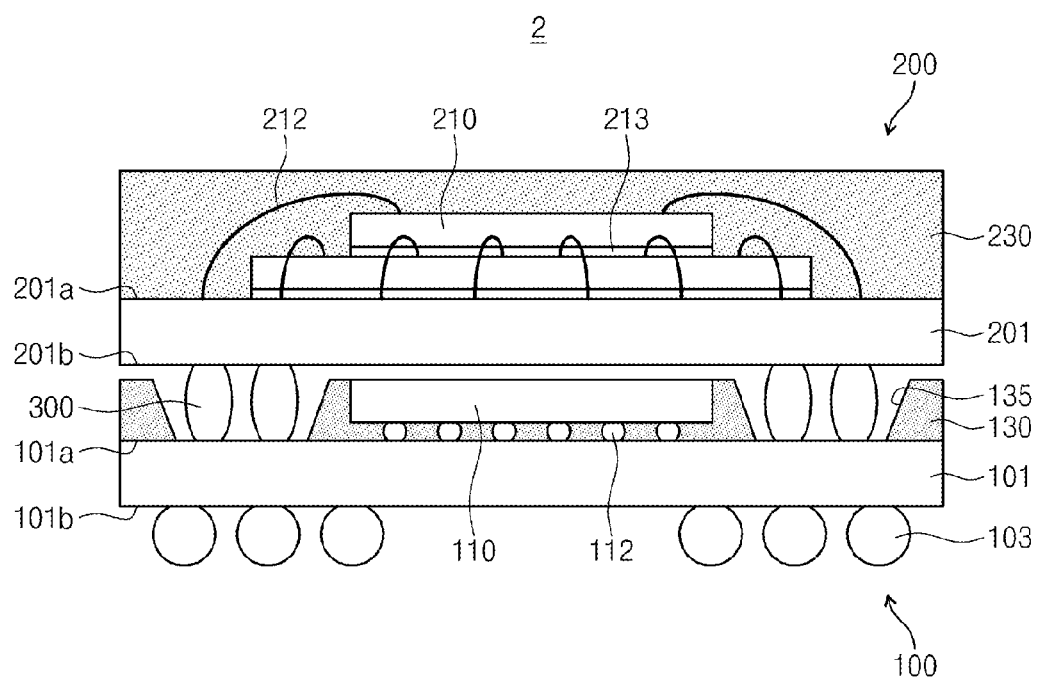

FIGS. 3A through 3C are cross-sectional views illustrating a method of fabricating a semiconductor package, according to other example embodiments of the inventive concept. For the sake of brevity, the elements and features of this example that are similar to those previously shown and described will not be described in much further detail.

Referring to FIG. 3A, the lower semiconductor chip 110 may be mounted on the center region of the top surface 101a of the lower package substrate 101 using surface mounting techniques such as a flip-chip bonding technique using the conductive bumps 112. Then, the lower terminals 120 may be formed on the edge region of the top surface 101a of the lower package substrate 101 and spaced apart from the side surface 113 of the lower semiconductor chip 110. Thereafter, a mold material may be coated on the resulting structure and patterned (for example, using a laser drilling process) to form the lower mold layer 130 having the opening 135 that exposes the lower terminals 120. As a result, the lower package 100 may be formed.

As previously shown in FIG. 2B, the opening 135 may extend substantially parallel to the side surface 113 of the lower semiconductor chip 110, thereby having a trench-shaped structure exposing the lower terminals 120. The opening 135 may extend substantially the entire length of one or more sides of the lower semiconductor chip 110. The lower mold layer 130 may be divided by the opening 135 so as to include the inner lower mold layer 131 enclosing or covering the side surface 113 of the lower semiconductor chip 110 and the outer lower mold layer 132 provided on the edge region of the lower package substrate 101. In some embodiments, the opening 135 may have the internal side surface 135s arranged at an angle to the lower package substrate 101 and is spaced apart from the lower terminals 120. The opening 135 may be formed to have a width that increases with increasing distance from the lower package substrate 101. For example, an angle θ1 of the internal side surface 135s relative to the top surface 101a of the lower package substrate 101 may be less than about 90°. The angle θ1 of the internal side surface 135s may range, but be not limited to, from about 45° to about 90°. The lower mold layer 130 may be formed to enclose the side surface 113 of the lower semiconductor chip 110 and expose the top surface 110a of the lower semiconductor chip 110.

Referring to FIG. 3B, the upper package 200 may be stacked on the lower package 100. As previously described with reference to FIG. 1C, the upper package 200 may include the upper package substrate 201 (e.g., a printed circuit board), the at least one upper semiconductor chip 210 stacked on the top surface 201a of the upper package substrate 201 and electrically connected to the upper package substrate 201, for example, using bonding wires 121, the upper mold layer 230 molding the upper semiconductor chips 210, and the upper terminals 220 attached to the bottom surface 201b of the upper package substrate 201.

According to the present embodiment, even when the upper package 200 is not properly aligned with the lower package 100, the slanted internal side surface 135s of the opening 135 may allow the upper package 200 to slide such that the upper package 200 may become aligned with the lower package 100.

Referring to FIG. 3C, the reflow process may be performed to a stack of the lower and upper packages 100 and 200, forming connection terminals 300. As a result, a POP type semiconductor package 2 may be fabricated to have the stack of the lower and upper packages 100 and 200, which are electrically connected to each other by the connection terminals 300.

Still Other Example Embodiments

Figure 4A:
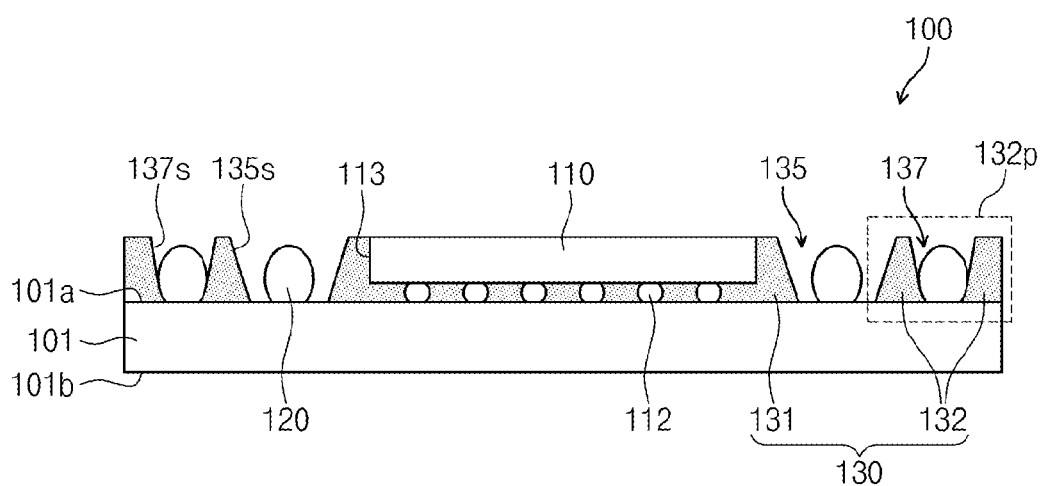
FIGS. 4A through 4C are cross-sectional views illustrating a method of fabricating a semiconductor package, according to still other example embodiments of the inventive concept.
Figure 4B:
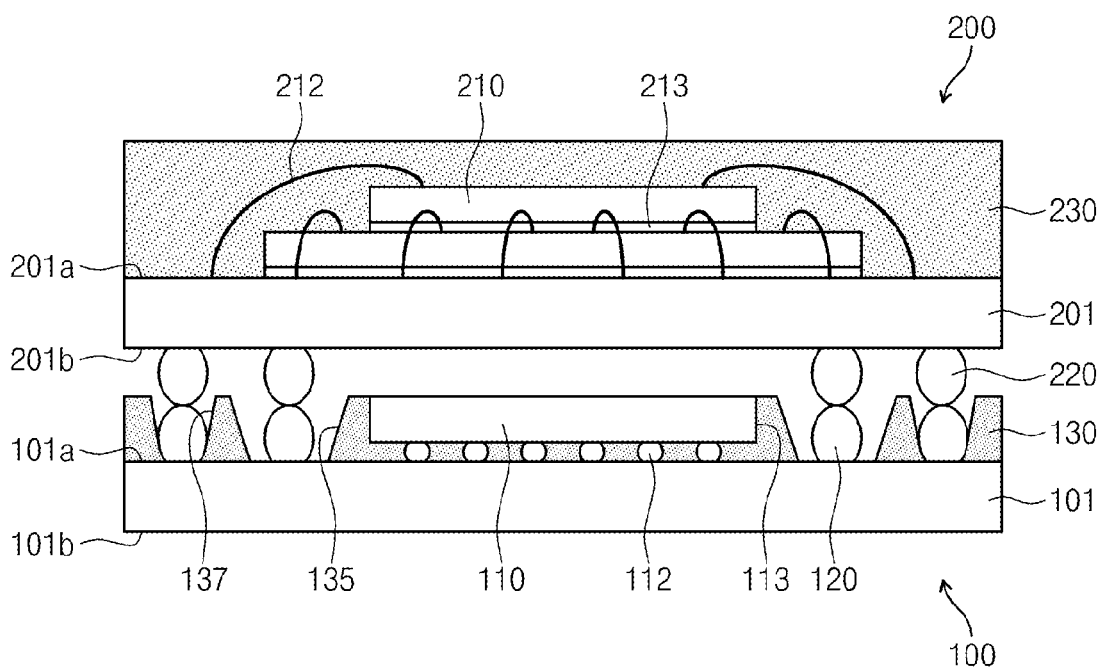
Figure 4C:
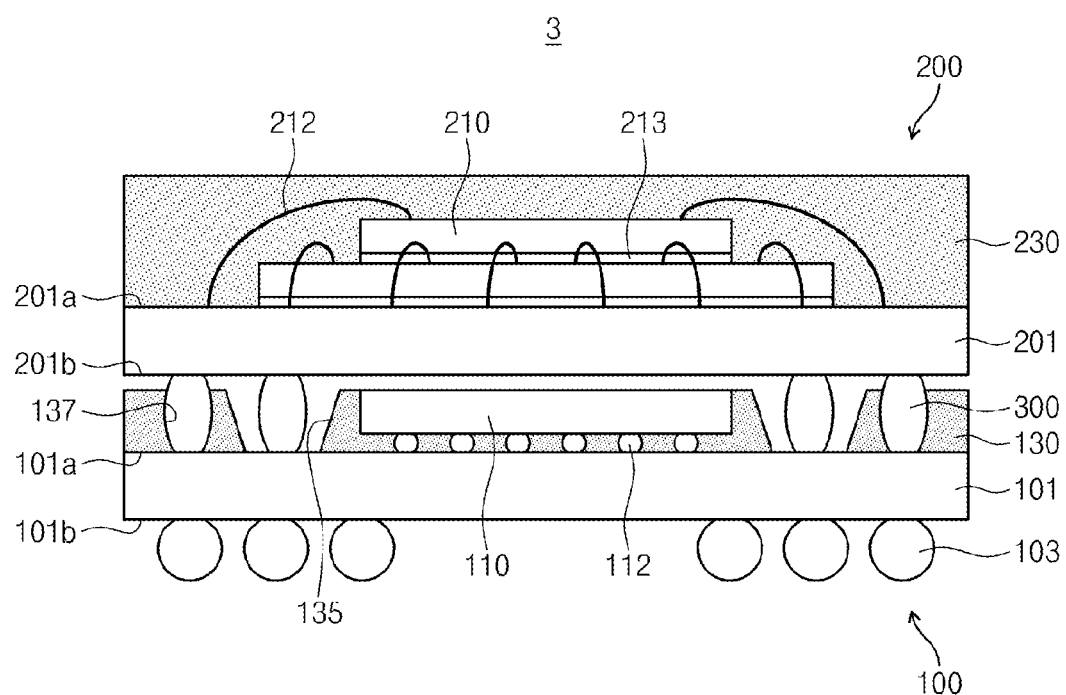
Figure 4D:
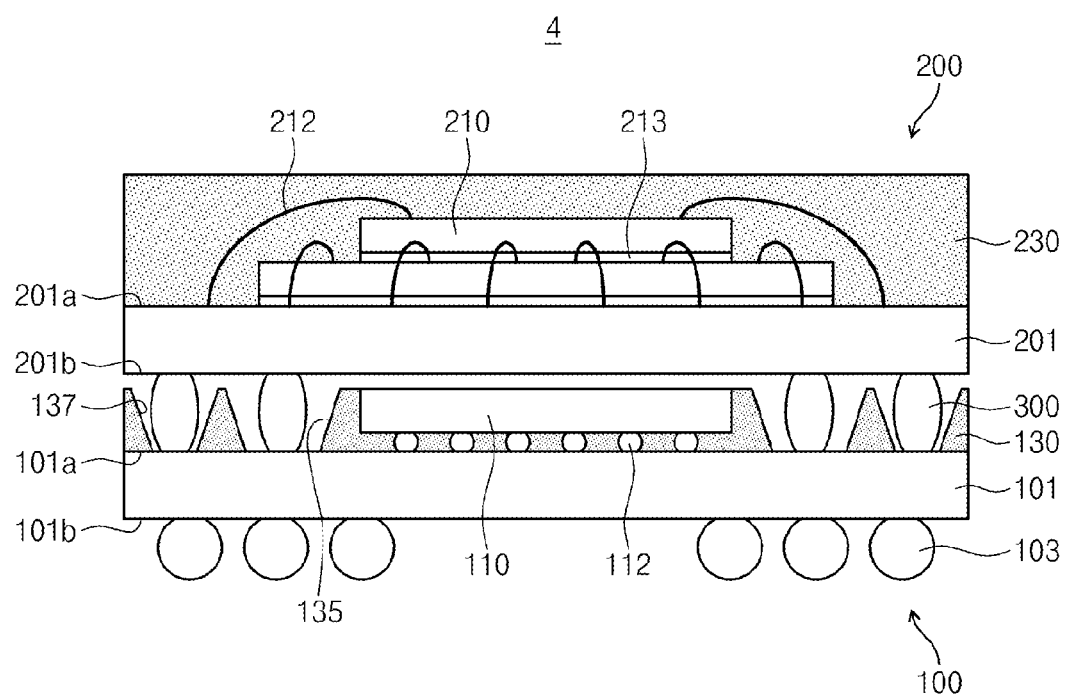
FIG. 4D is a sectional view illustrating a modification of FIG. 4C.
Figure 5A:
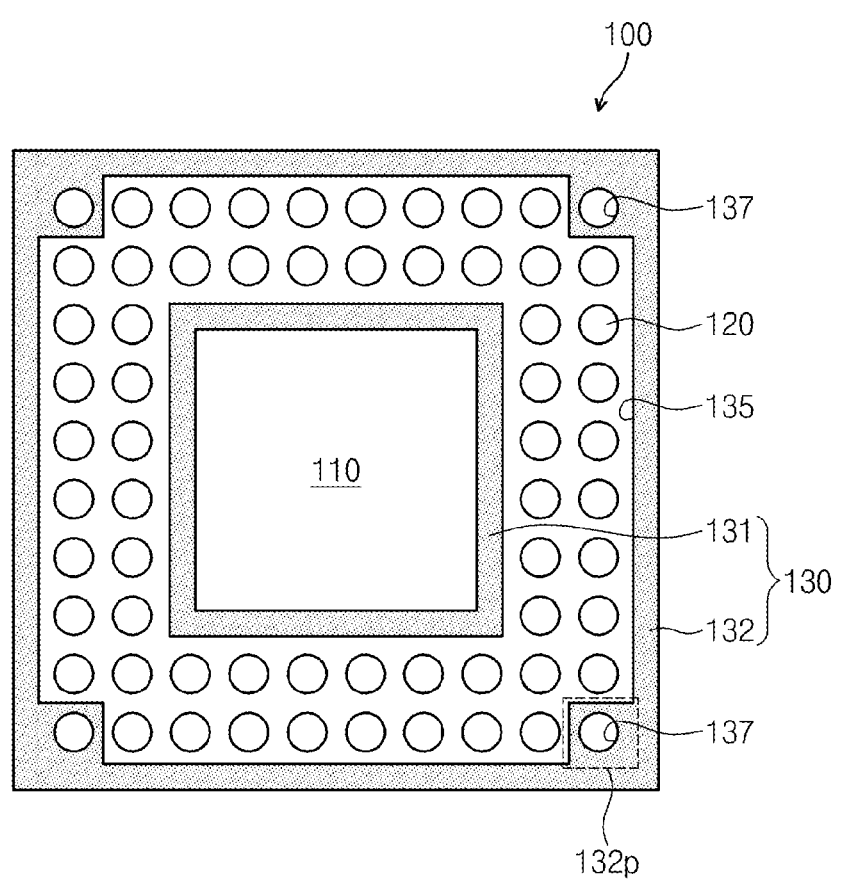
FIG. 5A is a plan view of FIG. 4A.
Figure 5B:
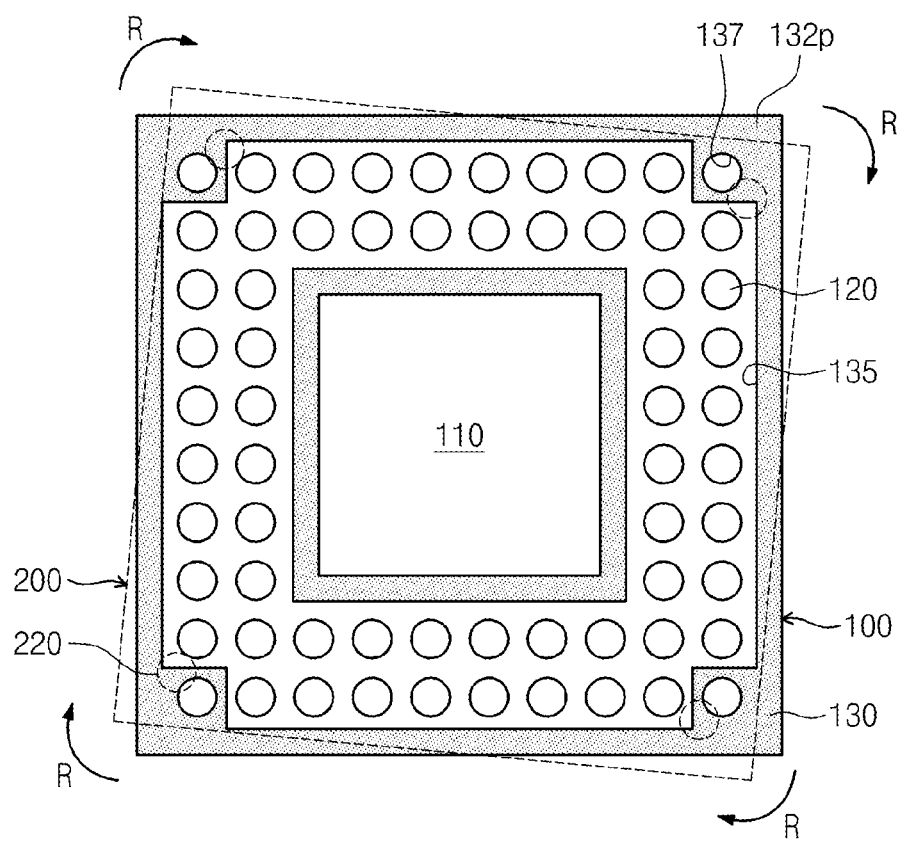
FIG. 5B is a plan view of FIG. 4B.

FIGS. 4A through 4C are cross-sectional views illustrating a method of fabricating a semiconductor package, according to still other example embodiments of the inventive concept, and FIG. 4D is a cross-sectional view illustrating a modification of FIG. 4C. Further, FIGS. 5A and 5B are plan views of FIGS. 4A and 4B, respectively. For the sake of brevity, the elements and features of this example that are similar to those previously shown and described will not be described in further detail.

Referring to FIG. 4A, the lower semiconductor chip 110 may be mounted on the center region of the top surface 101a of the lower package substrate 101 using the conductive bumps such as solder bumps 112 in a flip-chip bonding manner. Then, the lower terminals 120 may be formed on the edge region of the top surface 101a of the lower package substrate 101 and spaced apart from the side surface 113 of the lower semiconductor chip 110. Thereafter, a mold material may be coated on the resulting structure and patterned (for example, using a laser drilling process) to form a lower mold layer 130. The lower mold layer 130 may be formed to have the opening 135 and a second opening 137 each exposing corresponding ones of the lower terminals 120.

As shown in FIG. 5A, the lower mold layer 130 may be divided into an inner lower mold layer 131 enclosing the side surface 113 of the lower semiconductor chip 110 and an outer lower mold layer 132 provided on the edge region of the lower package substrate 101. The outer lower mold layer 132 may include at least one protruding portion 132p extending from its corner portion toward the lower semiconductor chip 110. The second opening 137 may be formed in the protruding portion 132p to expose at least one of the lower terminals 120 provided at a corresponding corner of the top surface 101a of the lower package substrate 101.

The opening 135 may continuously extend parallel to the side surface 113 of the lower semiconductor chip 110 to have a trench-shaped structure. The opening 135 may be formed by linearly moving a laser beam. The second opening 137 may be formed by circularly moving a laser beam, and thereby have a hole-shaped structure. At least one of the internal side surface 135s of the opening 135 and an internal side surface 137s of the second opening 137 may be slanted or substantially perpendicular to the top surface 101a of the lower package substrate 101. In some embodiments, the second opening 137 may be formed to expose a top portion of the lower terminal 120 but not to expose a bottom portion of the lower terminal 120.

Referring to FIG. 4B, the upper package 200 may be stacked on the lower package 100. As previously described with reference to FIG. 1C, the upper package 200 may include the upper package substrate 201, the at least one upper semiconductor chip 210 (stacked on the top surface 201a of the upper package substrate 201 and electrically connected to the upper package substrate 201, for example, using the bonding wires 121), the upper mold layer 230 molding the upper semiconductor chips 210, and the upper terminals 220 attached to the bottom surface 201b of the upper package substrate 201.

According to the present embodiment, due to the presence of the second opening 137, it is possible to substantially prevent the upper package 200 from being rotated and thereby misaligned with the lower package 100. For example, the upper terminal 220 inserted into the second opening 137 may serve as an obstacle to rotation of the upper package 200 relative to the lower package 100. Accordingly, a clockwise or counter-clockwise rotation R of the upper terminal 220 shown in FIG. 5B can be substantially prevented. In other words, the second opening 137 may allow the upper package 200 to be precisely aligned with the lower package 100.

Referring to FIG. 4C, the reflow process may be performed on a stack of the lower and upper packages 100 and 200, forming the connection terminals 300. As a result, a POP type semiconductor package 3 may be fabricated to have the stack of the lower and upper packages 100 and 200, which are electrically connected to each other by the connection terminals 300.

According to the present embodiment, the connection terminals 300 in the opening 135 may not be in contact with the lower mold layer 130, while the connection terminals 300 in the second opening 137 may be in contact with the lower mold layer 130.

Alternatively, unlike FIG. 4A, the second opening 137 may be formed to have a hole shape spaced apart from the lower terminal 120. In this case, as shown in FIG. 4D, it is possible to fabricate a POP type semiconductor package 4, in which the connection terminal 300 is not in contact with the second opening 137.

Other Example Embodiments

Figure 6A:
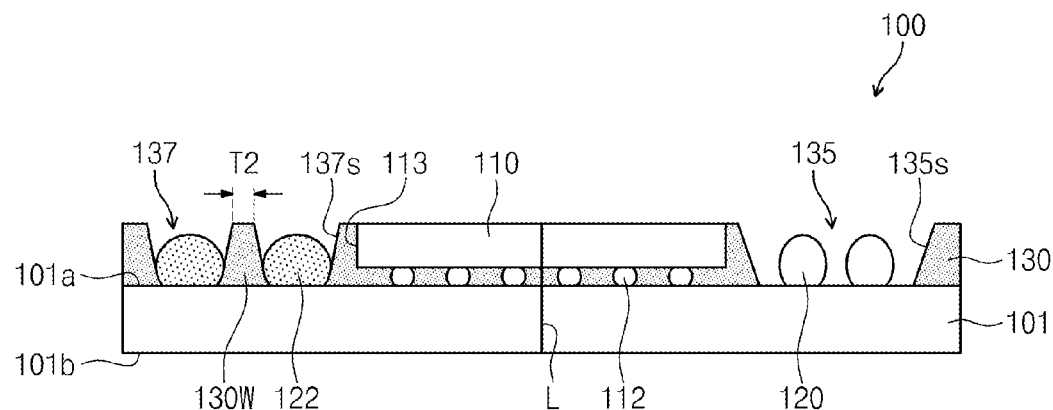
FIGS. 6A, 6B, 6C and 6E are cross-sectional views illustrating a method of fabricating a semiconductor package, according to some embodiments of the inventive concept.
Figure 6B:
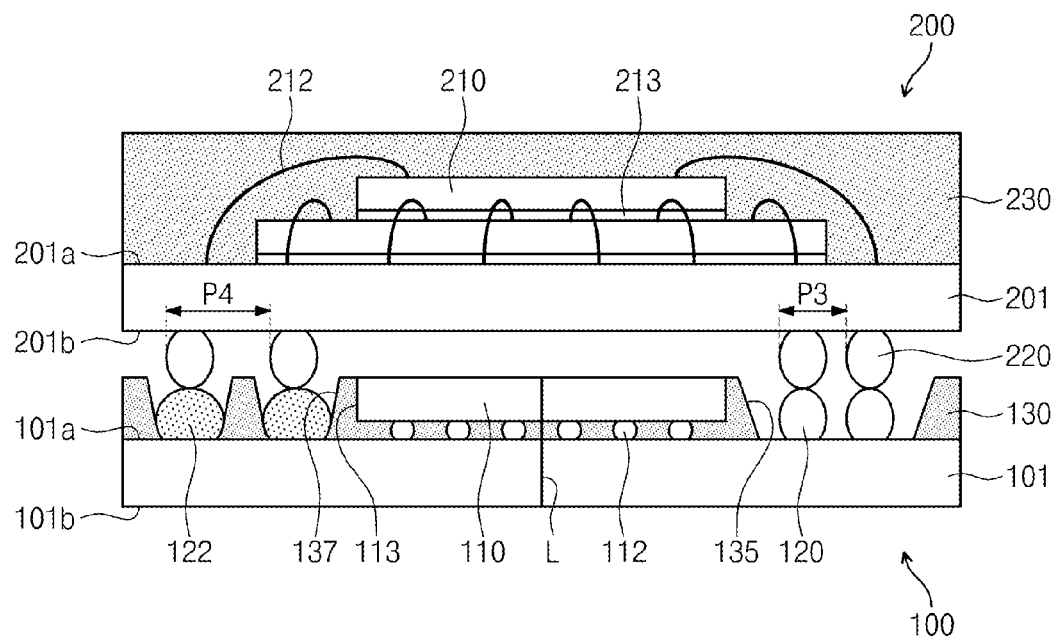
Figure 6C:
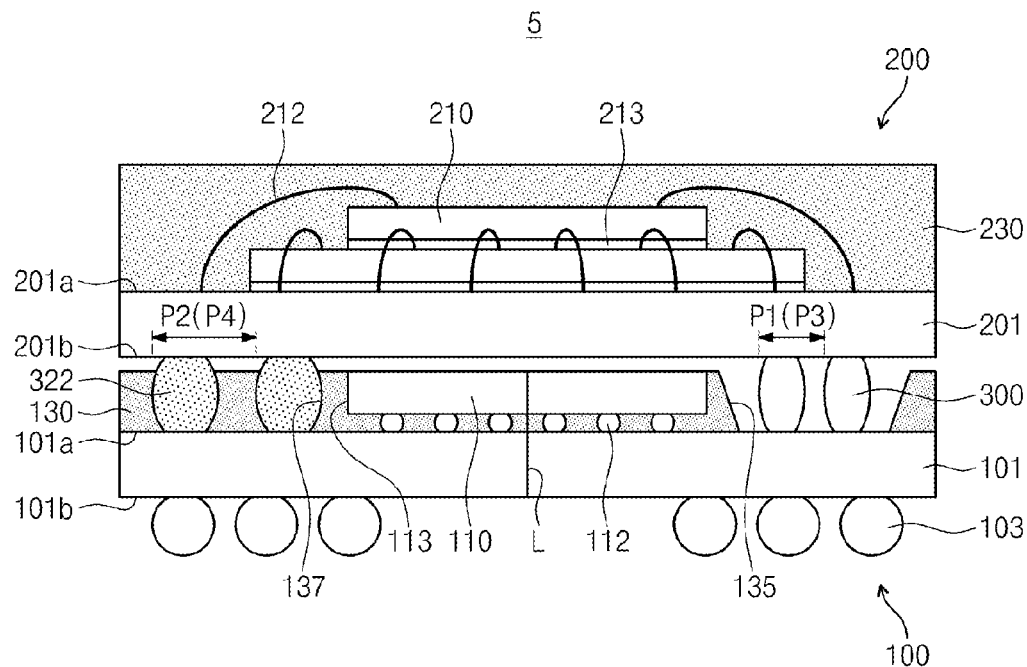
Figure 6D:
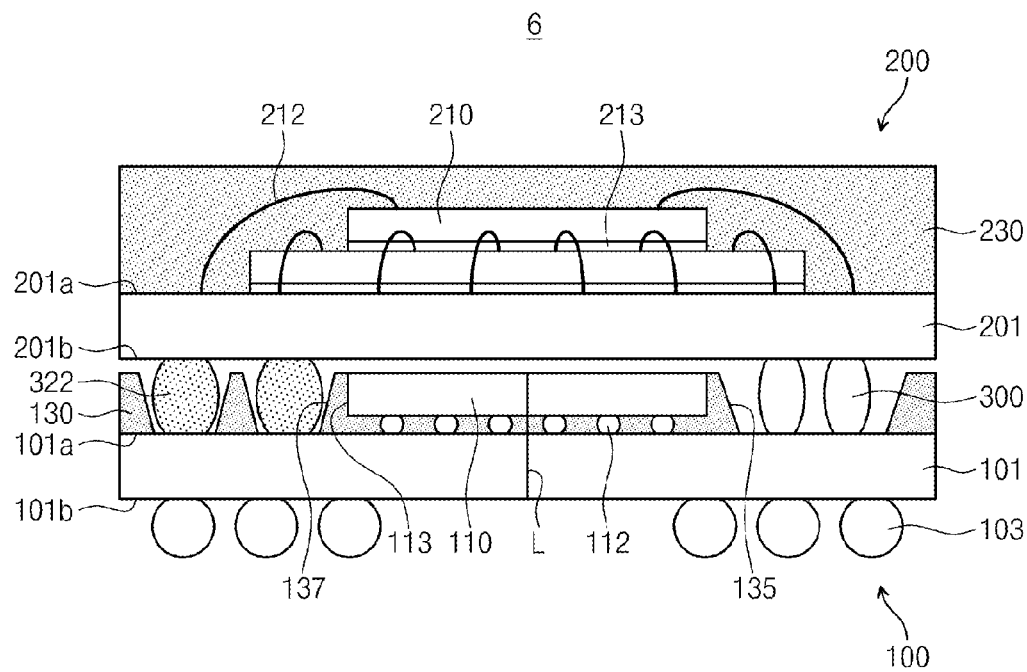
FIG. 6D is a sectional view illustrating a modification of FIG. 6C.
Figure 7:
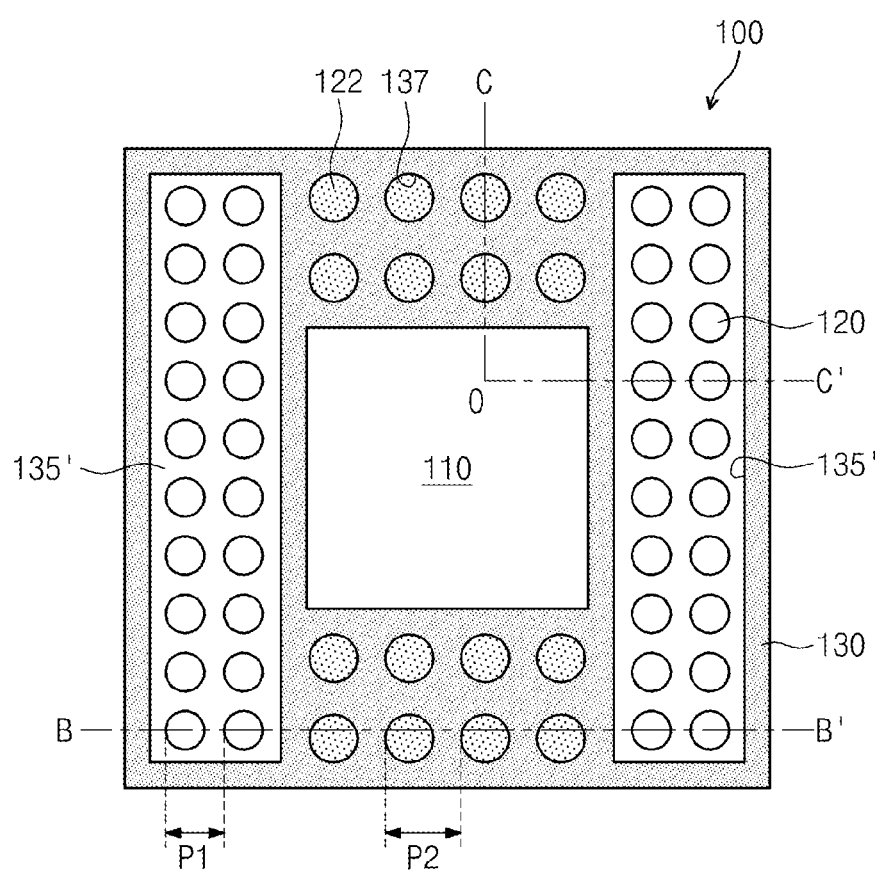
FIG. 7 is a plan view of FIG. 6A.

FIGS. 6A through 6C are cross-sectional views illustrating a method of fabricating a semiconductor package, according to other example embodiments of the inventive concept, and FIG. 6D is a cross-sectional view illustrating a modification of FIG. 6C. Further, FIG. 7 is a plan view of FIG. 6A. For the sake of brevity, the elements and features of this example that are similar to those previously shown and described will not be described in much further detail.

Figure 6E:
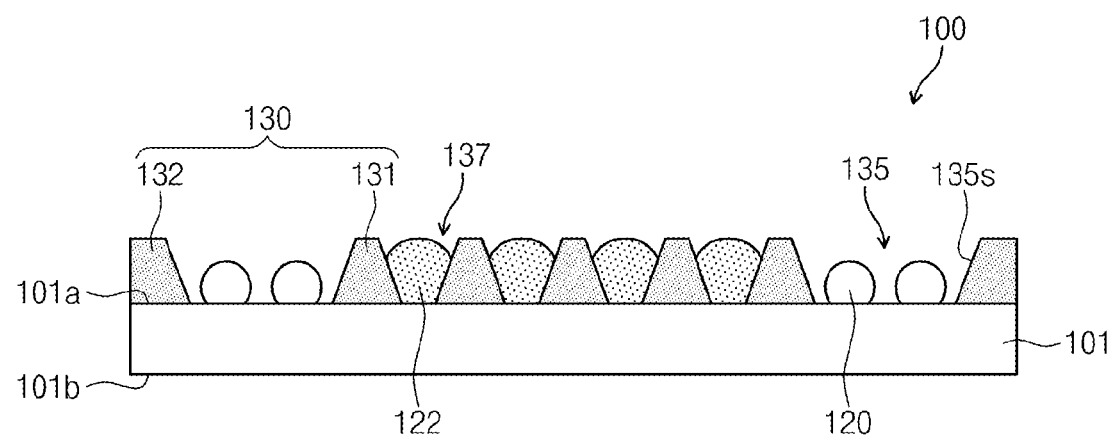

Referring to FIG. 6A, which is a cross-sectional view taken along line C-C' in FIG. 7, the lower semiconductor chip 110 may be mounted on the center region of the top surface 101a of the lower package substrate 101 using the conductive bumps such as solder bumps 112, for example, using a flip-chip bonding technique. Then, as shown in FIG. 6A and FIG. 6E (which is a cross-sectional view taken along line B-B' of FIG. 7), the lower terminals 120 and second lower terminals 122 may be formed on the edge region of the top surface 101a of the lower package substrate 101 and spaced apart from the side surface 113 of the lower semiconductor chip 110. There are two different (perpendicular) views along lines C-O and O-C' of FIG. 7, and these views are combined in FIG. 6A (the left and right portions being divided by a line L). Corresponding structure in FIGS. 6B, 6C, and 6D are similarly illustrated. Thereafter, a mold material may be coated on the resulting structure and patterned (for example, using a laser drilling process) to form the lower mold layer 130. The lower mold layer 130 may be formed to have first openings 135' exposing the lower terminals 120 and the second opening 137 exposing the second lower terminals 122. As shown, the first openings 135' may have a rectangular shape in plan view and may be formed on opposite edges of the semiconductor package 100 with the second openings 137 positioned therebetween. As a result, the lower package 100 may be formed.

According to the present embodiment, as shown in FIG. 7, the lower terminals 120 may be disposed to have a first pitch P1, while the second lower terminals 122 may be disposed to have a second pitch P2 different from the first pitch P1. In some embodiments, the first pitch P1 may be smaller than the second pitch P2. For example, the lower terminals 120 (having the small first pitch P1) may be disposed adjacent to left and right side surfaces (in plan view) of the lower semiconductor chip 110, and the second lower terminals 122 (having the large second pitch P2) may be disposed adjacent to top and bottom side surfaces (in plan view) of the lower semiconductor chip 110. Alternatively, the lower terminals 120 may be disposed spaced apart from left and bottom side surfaces of the lower semiconductor chip 110, thereby having an "L"-shaped arrangement, while the second lower terminals 122 may be disposed spaced apart from right and top side surfaces of the lower semiconductor chip 110, thereby having a 180-degree rotated "L"-shaped arrangement.

The first opening 135' exposing the lower terminals 120 of the small first pitch P1 may be formed to have a trench shape, while the second opening 137 exposing the second lower terminals 122 of the large pitch P2 may be formed to have a hole shape, i.e., a circular shape in plan view. At least one of the internal side surface 135s of the first opening 135' and an internal side surface 137s of the second opening 137 may be slanted or substantially perpendicular to the top surface 101a of the lower package substrate 101. In certain embodiments, the second opening 137 may be formed to expose a top portion of the second lower terminal 122 but not to expose a bottom portion of the second lower terminal 122. The mold wall 130w may be disposed between adjacent ones of the second lower terminals 122.

Referring to FIG. 6B, the upper package 200 may be stacked on the lower package 100. As previously described with reference to FIG. 1C, the upper package 200 may include the upper package substrate 201, the at least one upper semiconductor chip 210 (stacked on the top surface 201a of the upper package substrate 201 and electrically connected to the upper package substrate 201 using the bonding wires 121), the upper mold layer 230 molding the upper semiconductor chips 210, and the upper terminals 220 attached to the bottom surface 201b of the upper package substrate 201.

According to the present embodiment, identical or similar to the lower package 100 as shown in FIG. 7, some of the upper terminals 220 of the upper package 200 may be disposed to have a small pitch P3 (referred to hereinafter as a third pitch) and the others may be disposed to have a large pitch P4 (referred to hereinafter as a fourth pitch) as illustrated in FIG. 6B. For example, the upper terminals 220 connected to the lower terminals 120 may have the third pitch P3 equivalent or similar to the first pitch P1, and the upper terminals 220 connected to the second lower terminals 122 may have the fourth pitch P4 equivalent or similar to the second pitch P2.

Referring to FIG. 6C, a reflow process may be performed to a stack of the lower and upper packages 100 and 200, forming the connection terminals 300. As a result, a POP type semiconductor package 5 may be fabricated to have the stack of the lower and upper packages 100 and 200, which are electrically connected to each other by the connection terminals 300 having a small pitch P1/P3 and second connection terminals 322 having a large pitch P2/P4.

In other embodiments, as shown in FIG. 6D, unlike FIG. 6A, the second opening 137 may be formed to have a hole shape spaced apart from the second lower terminal 122. In this case, it is possible to fabricate a POP type semiconductor package 6, in which the second connection terminal 322 is not in contact with the second opening 137.

Yet Other Example Embodiments

Figure 8A:
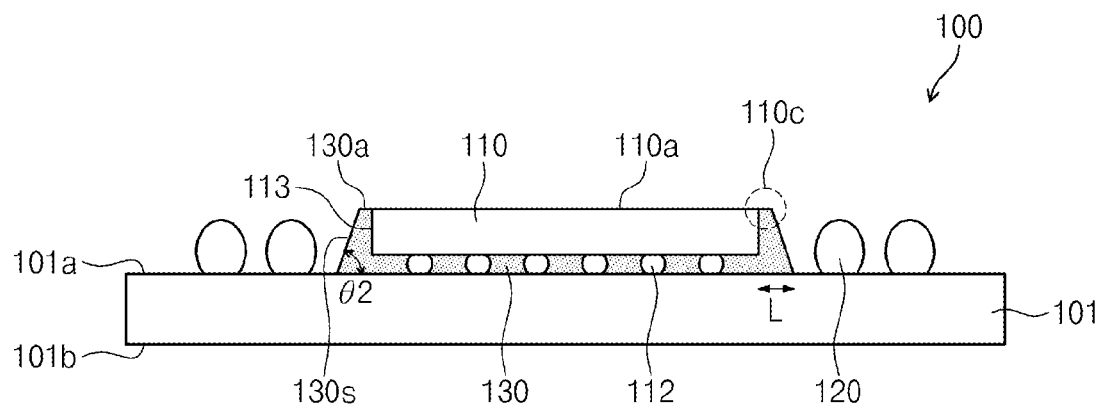
FIGS. 8A through 8C are sectional views illustrating a method of fabricating a semiconductor package, according to yet other example embodiments of the inventive concept.
Figure 8B:
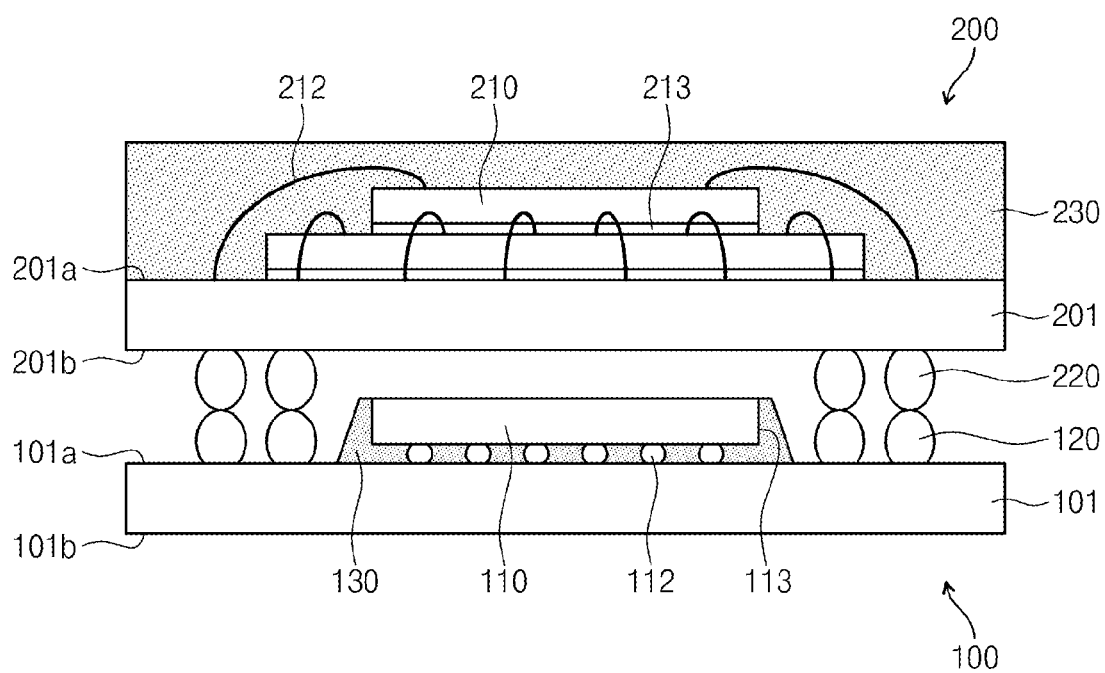
Figure 8C:
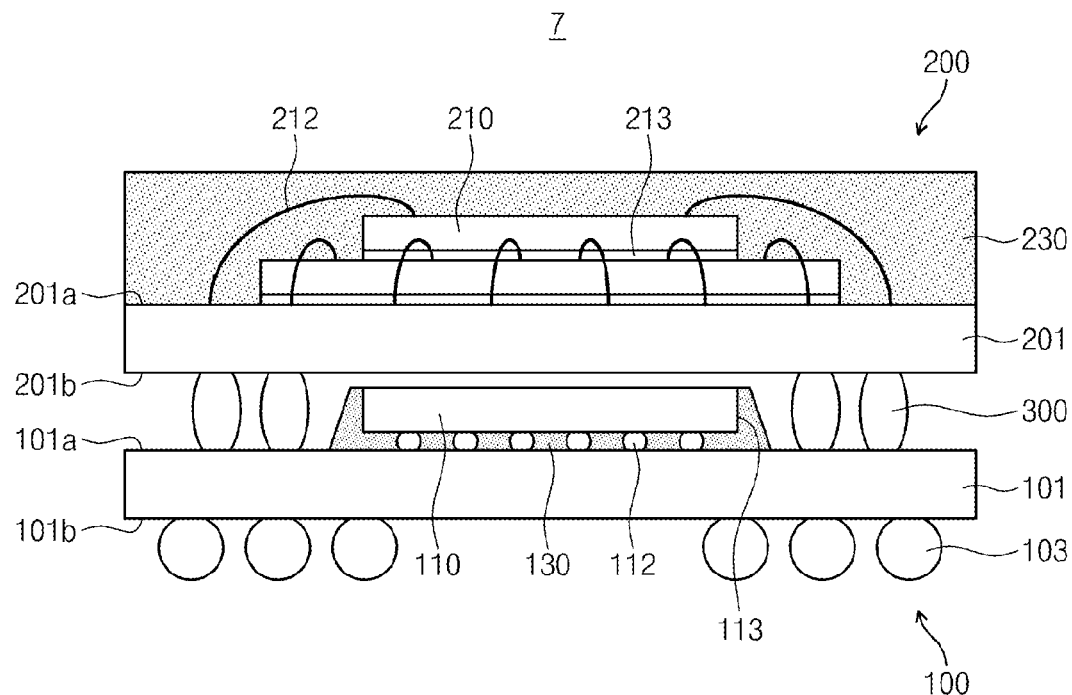
Figure 8D:
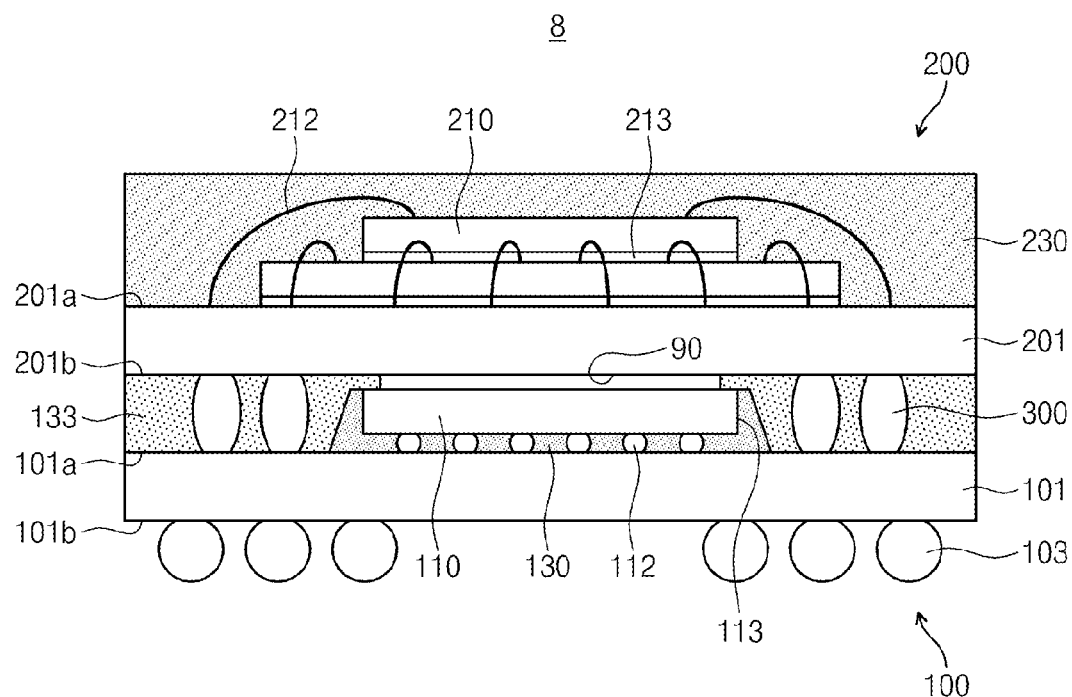
FIGS. 8D and 8E are sectional views illustrating modifications of FIG. 8C.
Figure 8E:
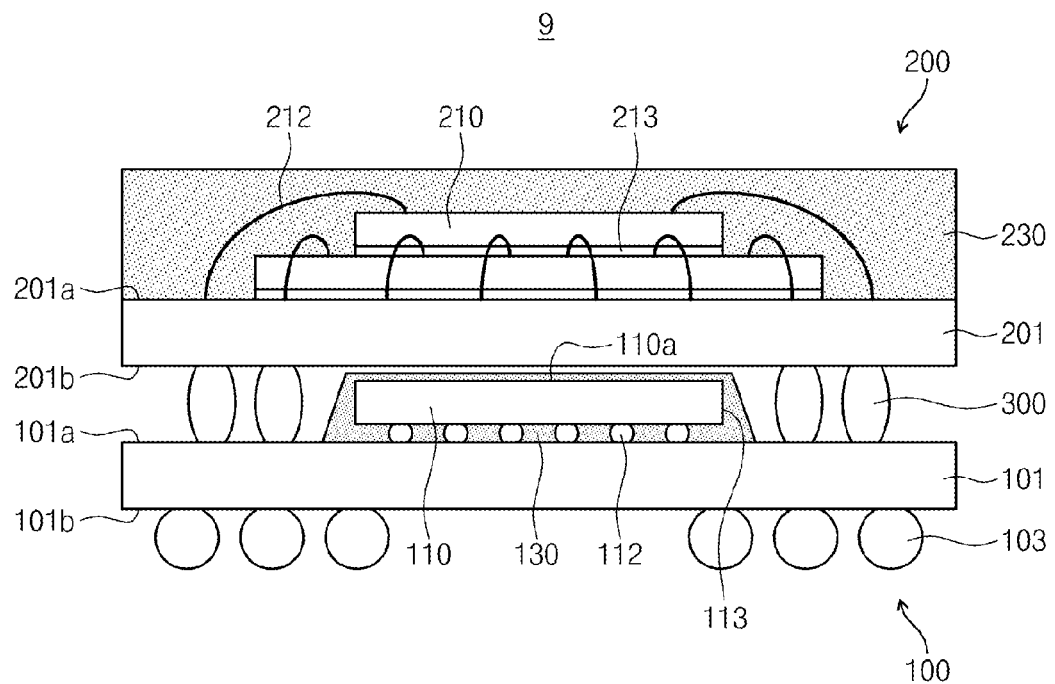
Figure 9:
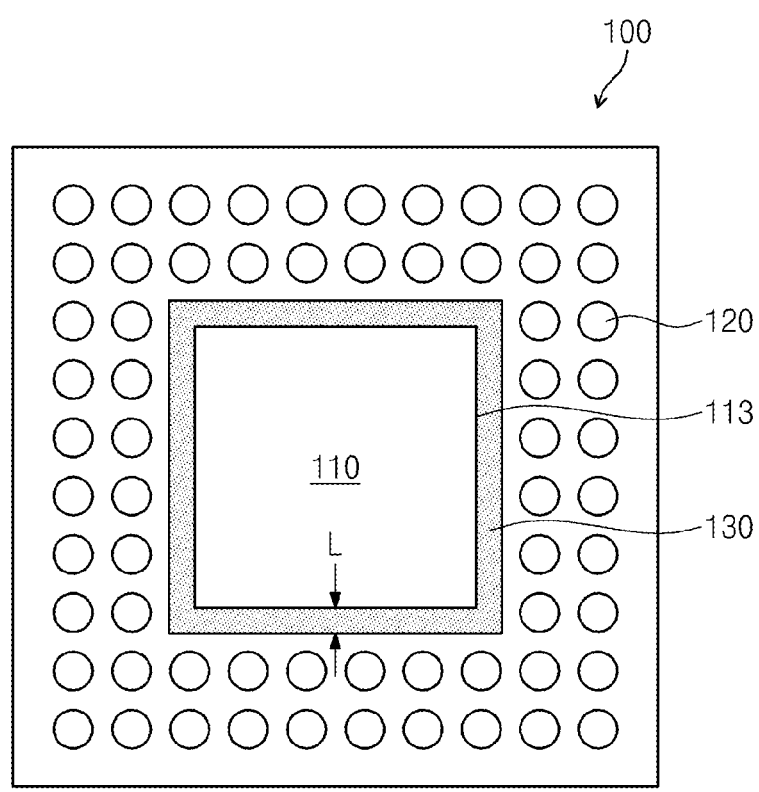
FIG. 9 is a plan view of FIG. 8A.

FIGS. 8A through 8C are cross-sectional views illustrating a method of fabricating a semiconductor package, according to yet other example embodiments of the inventive concept, and FIGS. 8D and 8E are cross-sectional views illustrating modifications of FIG. 8C. Further, FIG. 9 is a plan view of FIG. 8A. For the sake of brevity, the elements and features of this example that are similar to those previously shown and described will not be described in much further detail.

Referring to FIG. 8A, the lower semiconductor chip 110 may be mounted on the center region of the top surface 101a of the lower package substrate 101, for example, using the conductive bumps such as solder bumps 112 in a flip-chip bonding manner. Subsequently, the lower terminals 120 may be formed on the edge region of the top surface 101a of the lower package substrate 101 and spaced apart from the side surface 113 of the lower semiconductor chip 110. Thereafter, a mold material may be coated on the resulting structure and patterned (for example, using a laser drilling or etching process) to form the lower mold layer 130 molding the lower semiconductor chip 110. As a result, the lower package 100 may be formed. Alternatively, the lower mold layer 130 may be formed to mold the lower semiconductor chip 110, and then, the lower terminals 120 may be attached to the lower package substrate 101.

As shown in FIG. 9, the lower mold layer 130 may extend along the side surface 113 of the lower semiconductor chip 110 to wholly enclose the side surfaces of the lower semiconductor chip 110. This may make it possible to substantially prevent the corner portions 110c of the top surface 110a of the lower semiconductor chip 110 from being damaged or broken. In certain embodiments, the top surface 130a of the lower mold layer 130 may be substantially coplanar with the top surface 110a of the lower semiconductor chip 110. A height of the lower mold layer 130 may be substantially the same as or higher than a height of the lower semiconductor chip 110.

The lower mold layer 130 may have an outer side surface 130s that is at an angle to or substantially perpendicular to the top surface 110a of the lower semiconductor chip 110. The lower mold layer 130 may have a width that decreases with increasing distance from the lower package substrate 101, and thus, the outer side surface 130s may slant upwards. For example, the outer side surface 130s of the lower mold layer 130 may slant at an angle $\theta_2$ that is smaller than about 90°. The angle $\theta_2$ of the outer side surface 130s may range, for example, from about 45° to about 90°.

According to the present embodiment, the lower mold layer 130 may be formed to mold the lower semiconductor chip 110, but it may not be formed on the edge region of the top surface 101a of the lower package substrate 101, on which the lower terminals 120 are provided. Accordingly, it is possible to reduce a length L of a portion of the lower mold layer 130 protruding from the side surface of the lower semiconductor chip 110, and thus, it is possible to reduce an area or horizontal width of the lower mold layer 130 and/or a size of the lower package 100.

Referring to FIG. 8B, the upper package 200 may be stacked on the lower package 100. As previously described with reference to FIG. 1C, the upper package 200 may include the upper package substrate 201, the at least one upper semiconductor chip 210 (stacked on the top surface 201a of the upper package substrate 201 and electrically connected to the upper package substrate 201, for example, using the bonding wires 121), the upper mold layer 230 molding the upper semiconductor chips 210, and the upper terminals 220 attached to the bottom surface 201b of the upper package substrate 201.

Referring to FIG. 8C, the reflow process may be performed on a stack of the lower and upper packages 100 and 200, thereby forming the connection terminals 300. As a result, a POP type semiconductor package 7 may be fabricated to have the stack of the lower and upper packages 100 and 200, which are electrically connected to each other by the connection terminals 300.

In some embodiments, as shown in FIG. 8D, it is possible to fabricate a POP type semiconductor package 8, in which a second lower mold layer 133 is additionally provided between the upper package 200 and the lower package 100 of FIG. 8C. The second lower mold layer 133 may be formed to enclose the connection terminals 300, and furthermore, enclose the side surface of the lower semiconductor chip 110. The second lower mold layer 132 may be formed to fill or not fill a gap 90 between the lower semiconductor chip 110 and the upper package substrate 201.

Alternatively, as shown in FIG. 8E, it is possible to fabricate a POP type semiconductor package 9, in which the top surface 110a of the lower semiconductor chip 110 is covered with the lower mold layer 130.

Further Example Embodiments

FIGS. 10A through 10D are cross-sectional views of semiconductor packages fabricated by fabricating methods, according to further example embodiments of the inventive concept. For the sake of brevity, the elements and features of this example that are similar to those previously shown and described will not be described in much further detail.

Figure 10A:
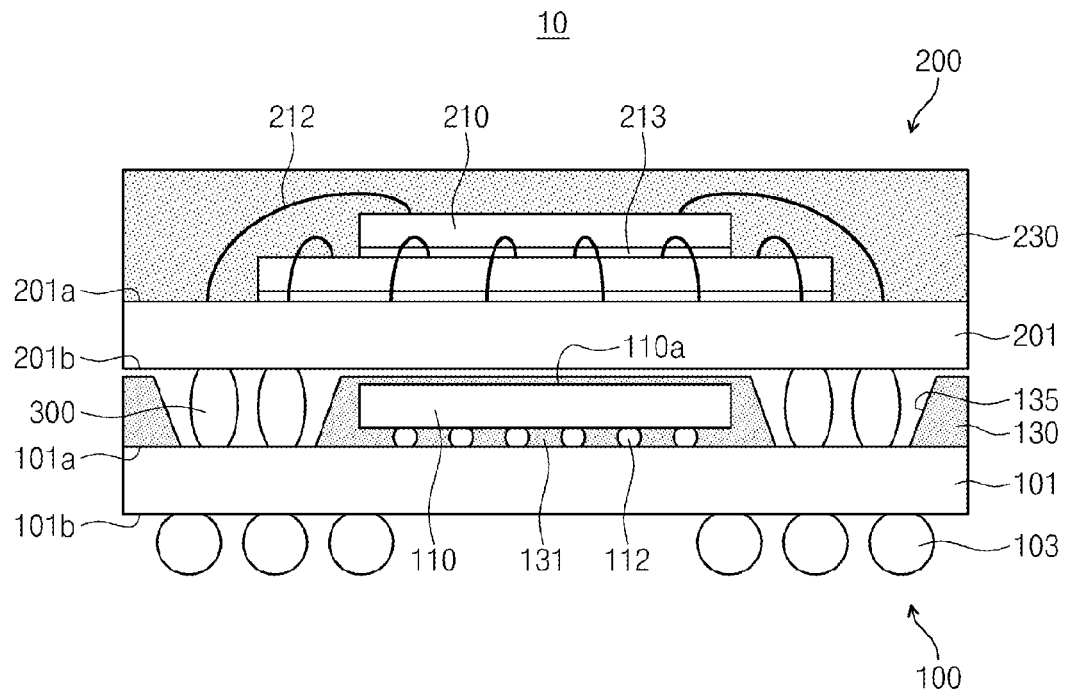
FIGS. 10A through 10D are sectional views of semiconductor packages fabricated by fabricating methods, according to example embodiments of the inventive concept.

Referring to FIG. 10A, a lower mold layer 130 may be formed to substantially completely mold the lower semiconductor chip 110. In this case, it is possible to fabricate a POP type semiconductor package 10, in which the top surface 110a of the lower semiconductor chip 110 is covered with the inner lower mold layer 131.

Figure 10B:
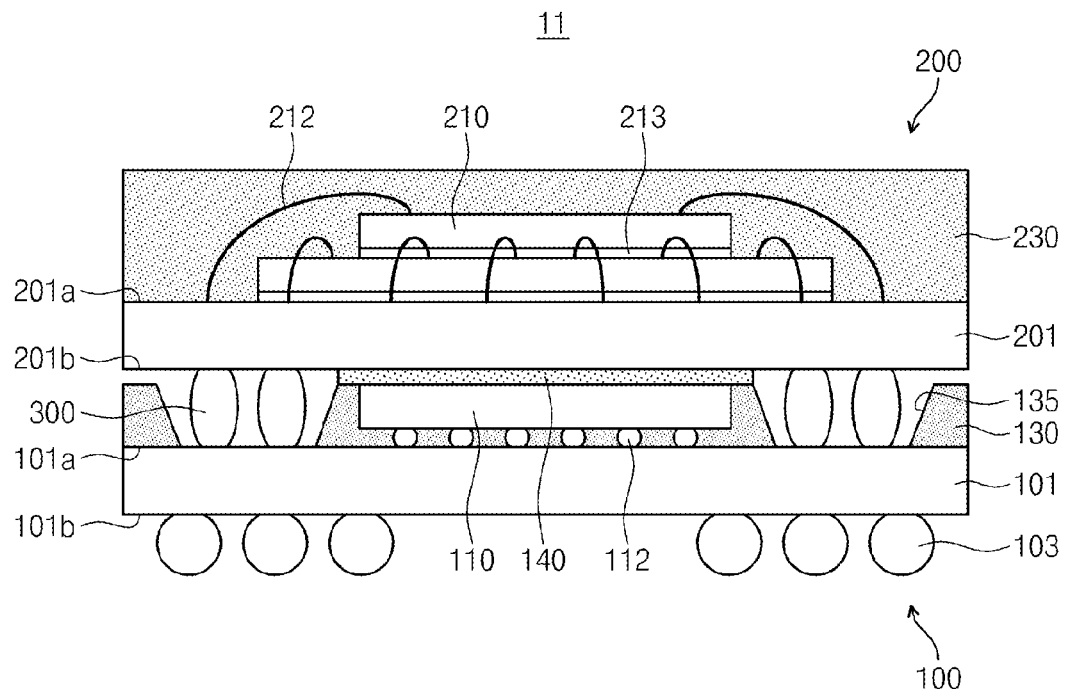

Referring to FIG. 10B, the lower package 100 may further include a heat-dissipation layer 140 attached to the lower semiconductor chip 110. The heat-dissipation layer 140 may include, for example, a thermal interface material (TIM). After the formation of the lower package 100, the stacking of the upper package 200 and the reflow process may be performed. In this case, a POP type semiconductor package 11 may be fabricated to include the heat-dissipation layer 140 between the lower package 100 and the upper package 200.

Figure 10C:
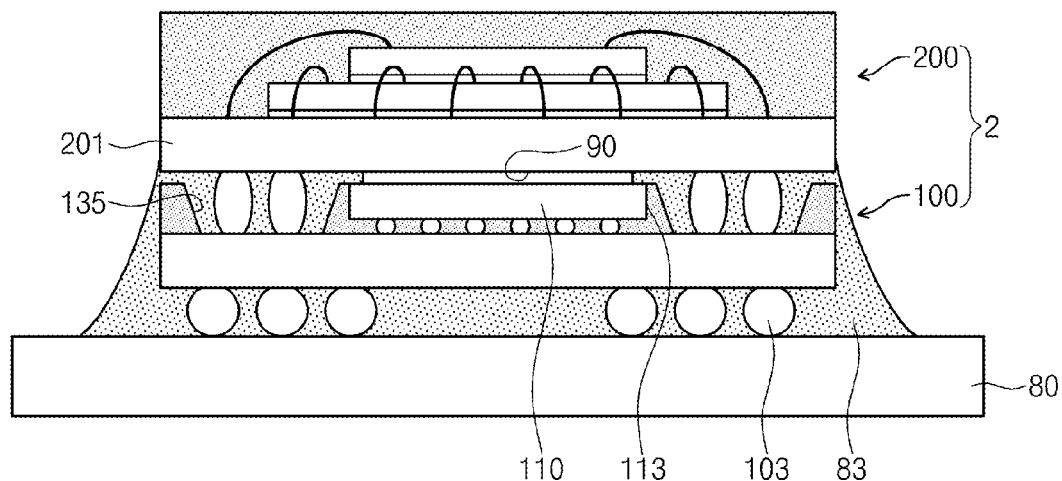

Referring to FIG. 10C, the semiconductor package 2 may be mounted on a base substrate 80 to form a POP-type semiconductor package 12. The base substrate 80 may include, for example, a printed circuit board, a main board for electronic devices (such as computers or mobile phones), or a module substrate (such as a memory module). The semiconductor package 2 may be electrically connected to the base substrate 80 using the external terminals 103. In some embodiments, an outer mold layer 83 may be further formed to mold at least a portion of the semiconductor package 2.

For example, the outer mold layer 83 may be formed to mold the lower package 100. The outer mold layer 83 may fill the opening 135 and additionally enclose the side surface 113 of the lower semiconductor chip 110. The outer mold layer 83 may be formed to fill or not fill the gap 90 between the lower semiconductor chip 110 and the upper package substrate 201.

Figure 10D:
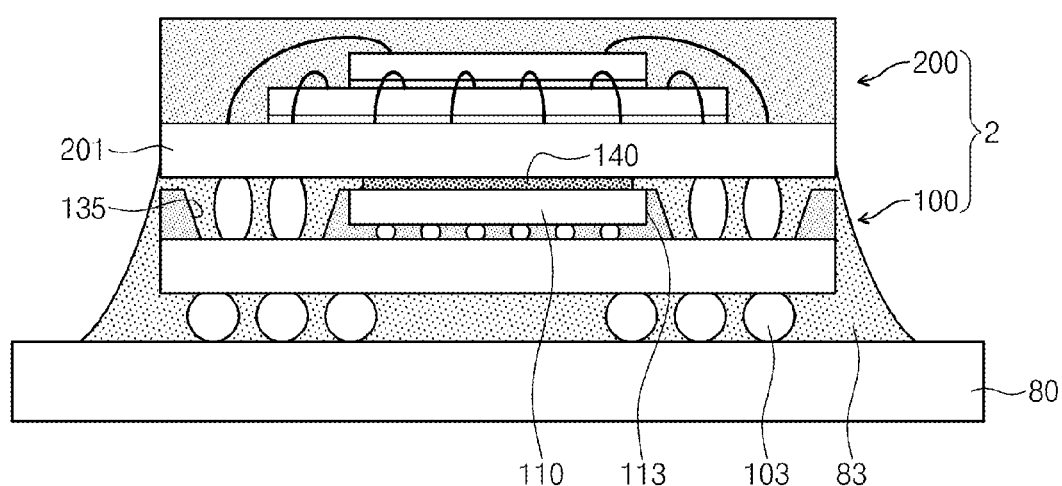

One of the semiconductor packages 1 and 3-11, instead of the semiconductor package 2, may be mounted on the base substrate 80. For example, the semiconductor package 11 of FIG. 10B may be mounted on the base substrate 80, and then, the outer mold layer 83 may be optionally formed to fabricate a POP-type semiconductor package 13, as shown in FIG. 10D.

Applications

Figure 11A:
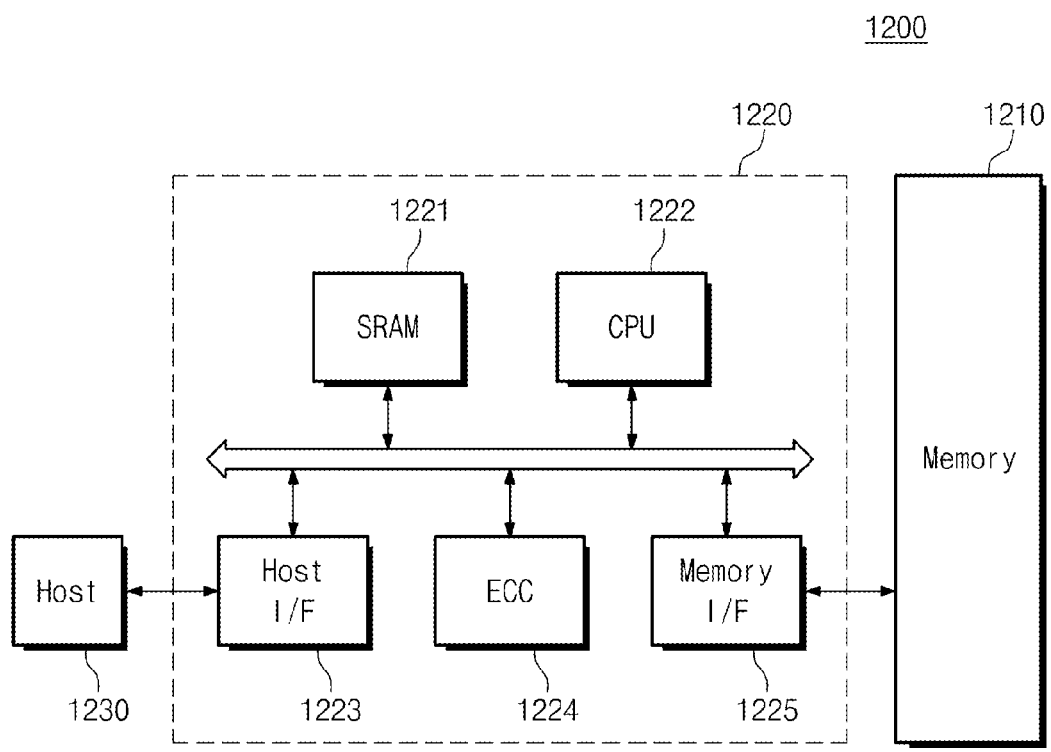
FIG. 11A is a block diagram illustrating an example of memory cards including a semiconductor package according to example embodiments of the inventive concept.

FIG. 11A is a block diagram illustrating a memory card including the semiconductor packages according to example embodiments of the inventive concept.

Referring to FIG. 11A, a memory card 1200 may include a host 1230, a memory device 1210, and a memory controller 1220 controlling data exchanges therebetween. A static random access memory (SRAM) 1221 may be used as an operating memory of a processing unit 1222. A host interface 1223 may include a data exchange protocol of a host connected to a memory card 1200. An error correction block 1224 may be configured to detect and correct errors included in data read from a memory device 1210. A memory interface 1225 may be configured to interface with the memory device 1210. The processing unit 1222 may perform general control operations for data exchange of the memory controller 1220. The memory device 1210 may include at least one of the semiconductor packages 1-13 according to example embodiments of the inventive concept.

Figure 11B:
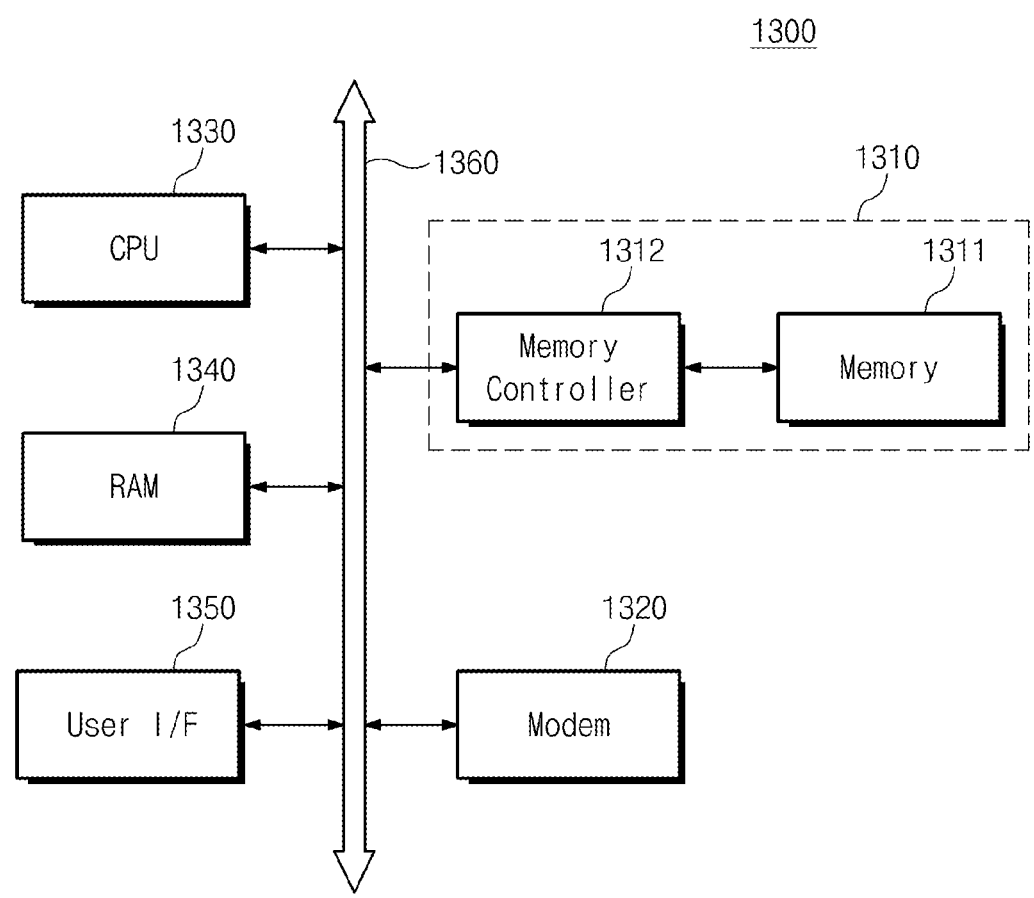
FIG. 11B is a block diagram illustrating an example of information processing systems including a semiconductor package according to example embodiments of the inventive concept.

FIG. 11B is a block diagram illustrating an example of information processing systems including a semiconductor package according to example embodiments of the inventive concept.

Referring to FIG. 11B, an information processing system 1300 may be realized using a memory system 1310 including at least one of the semiconductor packages 1-13 according to example embodiments of the inventive concept. For instance, the information processing system 1300 may be a mobile device and/or a computer. In example embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312, and in some embodiments, the memory system 1310 may be configured substantially identical to the memory card 1200 described with respect to FIG. 11A. Data processed by the CPU 1330 and/or input from the outside may be stored in the memory system 1310. In certain embodiments, the information processing system 1300 may further include or be, for example, an application chipset, a camera image sensor, a camera image signal processor (ISP), an input/output device, or the like. For example, the memory system 1310 may be provided in the form of the semiconductor disk device (SSD), and in this case, the information processing system 1300 may stably and reliably store a large amount of data in the memory system 1310.

According to example embodiments of the inventive concept, the mold layer may be patterned using, for example, a laser drilling process to form a trench-shaped opening exposing solder balls. Any mold wall may not be formed between adjacent ones of the solder balls. Accordingly, it is possible to prevent technical problems (for example, collapse or falling of a mold wall, occurrence of short circuit between the solder balls, an increase in electric resistance of the solder ball, and so forth), which may be caused by a reduction in pitch of the solder balls. Further, since the opening is formed spaced apart from the solder ball, it is possible to prevent a notch from being formed in the solder ball. Accordingly, it is possible to improve mechanical and electric characteristics of the semiconductor package.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor package comprising:
   an upper semiconductor package stacked on a lower semiconductor package; and
   a plurality of connection terminals electrically connecting the lower and upper semiconductor packages,
   wherein the lower semiconductor package includes a lower semiconductor package substrate, a lower semiconductor chip mounted on the lower semiconductor package substrate, and a lower mold layer at least partially encapsulating the lower semiconductor chip,
   wherein the lower mold layer has a first opening formed therein,
   wherein two or more connection terminals are disposed within the first opening, and
   wherein the lower mold layer includes an inner mold layer and an outer mold layer having the first opening disposed therebetween.

2. The semiconductor package of claim 1, wherein a top surface of the lower package substrate is exposed through the first opening.

3. The semiconductor package of claim 1, wherein a bottom surface of the first opening is spaced apart from a top surface of the lower package substrate.

4. The semiconductor package of claim 1, wherein a bottom surface of the first opening is defined by a portion of the lower mold layer.

5. The semiconductor package of claim 1, wherein the first opening has a trench shape.

6. The semiconductor package of claim 1, wherein the two or more connection terminals are spaced apart from a sidewall of the first opening formed in the lower mold layer.

7. The package of claim 1, wherein the first opening extends along four sides of the lower semiconductor chip without interruption.

8. The package of claim 1, wherein the first opening has a substantially straight line shape.

9. The package of claim 1, wherein the lower mold layer includes at least one protruding portion at a corner of the lower package substrate, wherein a second opening is formed through the at least one protruding portion to expose at least one of the connection terminals at a corresponding corner of the lower semiconductor package.

10. The package of claim 9, wherein the second opening comprises a plurality of second openings, each having a hole shape.

11. The package of claim 9, wherein a first pitch between the connection terminals in the first opening is different from a second pitch between the connection terminals in the second openings.

12. The package of claim 11, wherein the first pitch is smaller than the second pitch.

13. The package of claim 1, wherein the first opening has an internal side surface arranged at an angle with respect to a top surface of the lower package substrate.

14. The package of claim 1, wherein the first opening has an internal side surface slanted with respect to a top surface of the lower package substrate.

15. The package of claim 1, wherein a top surface of the lower semiconductor chip is substantially coplanar with a top surface of the lower mold layer.

16. The package of claim 1, wherein a height of the lower mold layer is substantially the same as or higher than a height of the lower semiconductor chip.

17. The package of claim 1, wherein the first opening extends around substantially the entire perimeter of the lower semiconductor chip.

18. The package of claim 1, wherein the first opening comprises multiple trenches extending along fewer than all of sidewalls of the lower semiconductor chip.

19. The package of claim 1, wherein the upper semiconductor package includes an upper semiconductor package substrate and an upper semiconductor chip mounted on the upper semiconductor package substrate, further comprising another mold layer covering the lower mold layer.

20. A semiconductor package comprising:
   an upper semiconductor package stacked on a lower semiconductor package; and
   a plurality of connection terminals electrically connecting the lower and upper semiconductor packages,
   wherein the lower semiconductor package includes a lower semiconductor package substrate, a lower semiconductor chip mounted on the lower semiconductor package substrate, and a lower mold layer at least partially encapsulating the lower semiconductor chip,
   wherein the lower mold layer has a first opening formed therein,
   wherein two or more connection terminals are disposed within the first opening, and
   wherein the two or more connection terminals are spaced apart from a sidewall of the first opening formed in the lower mold layer.

* * * * *